US012670847B2

(12) United States Patent
Chae et al.

(10) Patent No.: US 12,670,847 B2
(45) Date of Patent: Jun. 30, 2026

(54) PIXEL, METHOD OF FABRICATING THE PIXEL, AND ELECTRONIC DEVICE

(71) Applicant: Samsung Display Co., LTD., Yongin-si (KR)

(72) Inventors: Soo Jung Chae, Yongin-si (KR); Byeong Wan Kim, Yongin-si (KR); Jae Hyoung Youn, Yongin-si (KR); Woo Bin Lee, Yongin-si (KR); Je Min Lee, Yongin-si (KR); Woo Cheol Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/002,958

(22) Filed: Dec. 27, 2024

(65) Prior Publication Data

US 2025/0316217 A1     Oct. 9, 2025

(30) Foreign Application Priority Data

Apr. 4, 2024     (KR) ........................ 10-2024-0046167

(51) Int. Cl.
*G09G 3/32*          (2016.01)
*H10H 29/01*         (2025.01)
(Continued)

(52) U.S. Cl.
CPC ............. *G09G 3/32* (2013.01); *H10H 29/012* (2025.01); *H10H 29/32* (2025.01); *H10H 29/49* (2025.01); *G09G 2310/0294* (2013.01)

(58) Field of Classification Search
CPC .. G09G 3/32; G09G 2310/0294; H10H 29/39; H10H 29/49; H10H 29/32; H10H 29/012; H10H 20/032; H10H 20/831; H10H 20/832; H10H 29/032; H10K 59/1213; H10K 59/1216; H10K 59/131;
(Continued)

(56) References Cited

U.S. PATENT DOCUMENTS 11,133,337 B2    9/2021  Watakabe et al.
2022/0020837 A1 *  1/2022  Kim ..................... H10K 59/126
(Continued)

FOREIGN PATENT DOCUMENTS

JP          7109902          8/2022
KR      10-0722853          5/2007
(Continued)

*Primary Examiner* — Muhammad N Edun
(74) *Attorney, Agent, or Firm* — Sughrue Mion, PLLC

(57)          ABSTRACT

A pixel may include a first bottom conductive layer including a plurality of first bottom conductive patterns, a second bottom conductive layer disposed on the first bottom conductive layer, and including a plurality of second bottom conductive patterns, and a semiconductor layer disposed on the second bottom conductive layer. The first bottom conductive layer may have a stacked structure including a first metal layer, an alloy layer, and a second metal layer stacked on each other. The second bottom conductive layer may have a stacked structure including a first metal layer, an alloy layer, and a second metal layer stacked on each other. A thickness of the alloy layer in the first bottom conductive layer may be greater than a thickness of the alloy layer in the second bottom conductive layer.

21 Claims, 26 Drawing Sheets

(51) Int. Cl.
    *H10H 29/32*       (2025.01)
    *H10H 29/49*       (2025.01)

(58) Field of Classification Search
    CPC ............. H10K 50/822; H10K 59/1201; H10K
               59/123; H10K 2102/351; H10K 50/813;
               H10K 50/816; H10K 50/826; H10K
               71/60; H10K 71/621; H10D 86/021;
               H10D 86/441; H10D 86/481
    See application file for complete search history.

(56)                References Cited

U.S. PATENT DOCUMENTS

| | | | |
|---|---|---|---|
| 2022/0384403 A1* | 12/2022 | Liu | .................... H10H 20/8515 |
| 2023/0027490 A1* | 1/2023 | Kang | .................... H01L 25/167 |
| 2023/0047134 A1 | 2/2023 | Lee et al. | |
| 2023/0117174 A1* | 4/2023 | Koo | ................... H10K 59/1213 |
| | | | 257/40 |

FOREIGN PATENT DOCUMENTS

| | | |
|---|---|---|
| KR | 10-2095463 | 3/2020 |
| KR | 10-2023-0023870 | 2/2023 |

* cited by examiner

PXij

LDL

VIA2

SD2

VIA1

SD1

ILD

GAT

GI

ATV

BUF

BML2

BI

BML1

SUB

DRT

1000

PIXEL, METHOD OF FABRICATING THE PIXEL, AND ELECTRONIC DEVICE

CROSS-REFERENCE TO RELATED APPLICATION(S)

This application claims priority to and benefits of Korean patent application number 10-2024-0046167 under 35 U.S.C. § 119, filed on Apr. 4, 2024 in the Korean Intellectual Property Office, the entire contents of which are incorporated herein by reference.

BACKGROUND

1. Technical Field

Various embodiments of the disclosure relate to a pixel, a method of fabricating the pixel, and an electronic device.

2. Description of Related Art

A display device may include pixels. Each of the pixels may emit light. The display device may combine light emitted from the respective pixels to display an image.

SUMMARY

Various embodiments of the disclosure are directed to a pixel having improved reliability, and a method of fabricating the pixel.

According to an embodiment of the disclosure, a pixel may include a first bottom conductive layer including a plurality of first bottom conductive patterns, a second bottom conductive layer disposed on the first bottom conductive layer, and including a plurality of second bottom conductive patterns, and a semiconductor layer disposed on the second bottom conductive layer. The first bottom conductive layer may have a stacked structure including a first metal layer, an alloy layer, and a second metal layer stacked on each other. The second bottom conductive layer may have a stacked structure including a first metal layer, an alloy layer, and a second metal layer stacked on each other. A thickness of the alloy layer in the first bottom conductive layer may be greater than a thickness of the alloy layer in the second bottom conductive layer.

In an embodiment, the alloy layer of the first bottom conductive layer may include an alloy of a first metal material included in the first metal layer of the first bottom conductive layer and a second metal material included in the second metal layer of the first bottom conductive layer. The alloy layer of the second bottom conductive layer may include an alloy of a first metal material included in the first metal layer of the second bottom conductive layer and a second metal material included in the second metal layer of the second bottom conductive layer.

In an embodiment, the first metal material of the first bottom conductive layer may include aluminum (Al), the first metal material of the second bottom conductive layer may include Al, the second metal material of the first bottom conductive layer may include titanium (Ti), and the second metal material of the second bottom conductive layer may include Ti.

In an embodiment, the pixel may further include a gate conductive layer disposed on the semiconductor layer, and including a plurality of gate conductive patterns, and a first source-drain (SD) conductive layer disposed on the gate conductive layer, and including a plurality of first source-drain (SD) conductive patterns.

In an embodiment, the gate conductive layer may have a stacked structure including a third metal layer and a fourth metal layer stacked on each other. The first SD conductive layer may have a stacked structure including a third metal layer and a fourth metal layer stacked on each other.

In an embodiment, the third metal layer of the gate conductive layer and the fourth metal layer of the gate conductive layer may directly contact each other. The third metal layer of the first SD conductive layer and the fourth metal layer of the first SD conductive layer may directly contact each other.

In an embodiment, a thickness of at least one of the fourth metal layer of the gate conductive layer and the fourth metal layer of the first SD conductive layer may be greater than a thickness of at least one of the second metal layer of the first bottom conductive layer and the second metal layer of the second bottom conductive layer.

In an embodiment, the pixel may further include a driving transistor connected between a first power voltage line and a second power voltage line, and including an upper gate electrode and a lower gate electrode, and a light emitting element connected between the driving transistor and the second power voltage line.

In an embodiment, the lower gate electrode of the driving transistor may include at least one of the plurality of second bottom conductive patterns.

In an embodiment, the pixel may further include a hold capacitor connected between the lower gate electrode of the driving transistor and the first power voltage line.

In an embodiment, a first terminal of the hold capacitor may include at least a portion of the lower gate electrode of the driving transistor. A second terminal of the hold capacitor may include at least one of the plurality of first bottom conductive patterns.

According to an embodiment of the disclosure, a method of fabricating a pixel may include forming a first bottom conductive layer including a plurality of first bottom conductive patterns, forming a second bottom conductive layer including a plurality of second bottom conductive patterns on the first bottom conductive layer, and forming a semiconductor layer on the second bottom conductive layer. The first bottom conductive layer may have a stacked structure including a first metal layer, an alloy layer, and a second metal layer stacked on each other. The second bottom conductive layer may have a stacked structure including a first metal layer, an alloy layer, and a second metal layer stacked on each other. A thickness of the alloy layer in the first bottom conductive layer may be greater than a thickness of the alloy layer in the second bottom conductive layer.

In an embodiment, the method may further include forming an insulating layer covering the first bottom conductive layer after forming the first bottom conductive layer.

In an embodiment, forming the insulating layer may further include heat-treating the insulating layer.

In an embodiment, the method may further include forming a buffer layer covering the second bottom conductive layer after forming the second bottom conductive layer.

In an embodiment, forming the buffer layer may further include heat-treating the buffer layer.

In an embodiment, the method may further include forming a gate insulating layer covering at least a portion of the semiconductor layer after forming the semiconductor layer.

In an embodiment, forming the gate insulating layer may further include heat-treating the gate insulating layer.

In an embodiment, the alloy layer of the first bottom conductive layer may include an alloy of a first metal material included in the first metal layer of the first bottom conductive layer and a second metal material included in the second metal layer of the first bottom conductive layer. The alloy layer of the second bottom conductive layer may include an alloy of a first metal material included in the first metal layer of the second bottom conductive layer and a second metal material included in the second metal layer of the second bottom conductive layer.

In an embodiment, the first metal material of the first bottom conductive layer may include aluminum (Al), the first metal material of the second bottom conductive layer may include Al, the second metal material of the first bottom conductive layer may include titanium (Ti), the second metal material of the second bottom conductive layer may include Ti.

According to an embodiment of the disclosure, an electronic device may include a processor to provide input image data, and a display device to display an image based on the input image data. The display device may include a pixel. The pixel may include a first bottom conductive layer including a plurality of first bottom conductive patterns, a second bottom conductive layer disposed on the first bottom conductive layer, and including a plurality of second bottom conductive patterns, and a semiconductor layer disposed on the second bottom conductive layer. The first bottom conductive layer may have a stacked structure including a first metal layer, an alloy layer, and a second metal layer stacked on each other. The second bottom conductive layer may have a stacked structure including a first metal layer, an alloy layer, and a second metal layer stacked on each other. A thickness of the alloy layer in the first bottom conductive layer may be greater than a thickness of the alloy layer in the second bottom conductive layer.

DETAILED DESCRIPTION OF THE EMBODIMENTS

Figure 1:
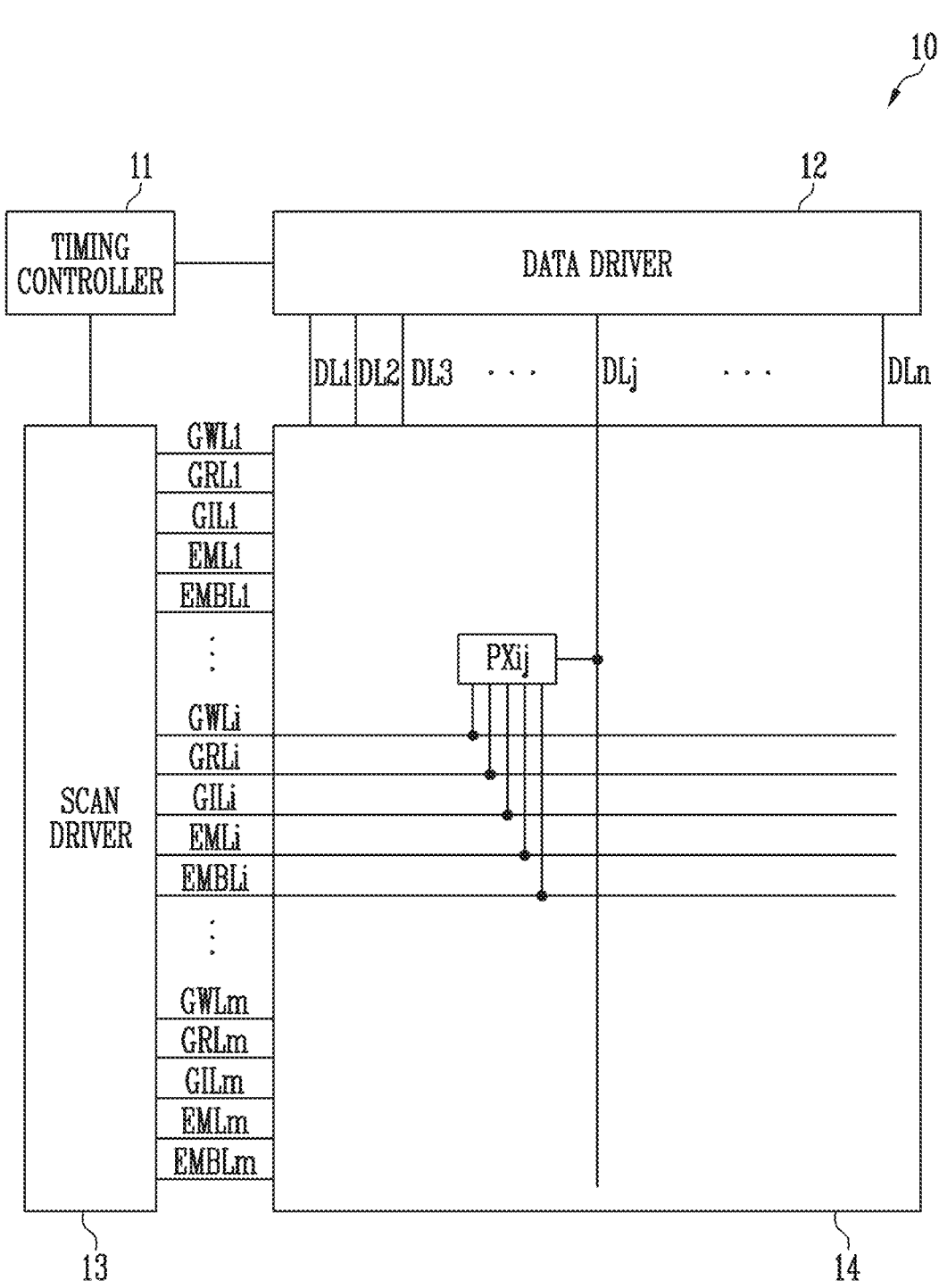
FIG. 1 is a schematic diagram illustrating a display device in accordance with embodiments of the disclosure.

Hereinafter, embodiments will be described in detail with reference to the attached drawings. In the following description, only parts for understanding of operations in accordance with the disclosure will be described, and explanation of the other parts will be omitted not to make the gist of the disclosure unclear. Accordingly, the disclosure is not limited to the embodiments set forth herein but may be embodied in other types. These embodiments are provided so that the disclosure will be thorough and complete, and will fully convey the technical spirit of the disclosure to those skilled in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element is referred to as being "coupled" or "connected" to another element, it can be directly coupled or connected to the other element or indirectly coupled or connected to the other element with intervening elements therebetween. The terminology used herein is for the purpose of describing particular embodiments only and is not intended to be limiting. The expression "at least one of X, Y, and Z" and "at least one selected from the group consisting of X, Y, and Z" may be construed as X only, Y only, Z only, or any combination of two or more of X, Y, and Z (for instance, XYZ, XYY, YZ, and ZZ). As used herein, the term "and/or" can include any and all combinations of one or more of the associated listed items. The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element or feature's relationship to another element(s) or feature(s), as illustrated in the drawings. Spatially relative terms are intended to encompass different orientations of an apparatus in use, operation, and/or manufacture in addition to the orientation depicted in the drawings. For example, if the device in the drawings is turned upside down, elements described as "below" or "beneath" other elements or features would then be oriented "above" the other elements or features. Thus, the term "below" can encompass both an orientation of above and below. Furthermore, the device may be otherwise oriented (e.g., rotated 90 degrees or at other orientations), and, as such, the spatially relative descriptors used herein interpreted accordingly.

Various embodiments will be described with reference to diagrams illustrating idealized embodiments. As such, variations from the shapes of the illustrations as a result, for example, of manufacturing techniques and/or tolerances, are to be expected. Therefore, embodiments disclosed herein should not be construed as limited to the particular illustrated shapes of regions, but are to include deviations in shapes that result from, for instance, manufacturing. As such, the shapes illustrated in the drawings may not illustrate the actual shapes of regions of a device, and, as such, are not intended to be limiting.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a display device 10 in accordance with embodiments of the disclosure.

Referring to FIG. 1, the display device 10 may include a timing controller 11, a data driver 12, a scan driver 13, and a pixel component 14.

The timing controller 11 may receive grayscale signals for an image (or a frame). The grayscale signals may include a first color grayscale signal, a second color grayscale signal, and a third color grayscale signal. The first color grayscale signal may be a grayscale signal for expressing a first color. The second color grayscale signal may be a grayscale signal for expressing a second color. The third color grayscale signal may be a grayscale signal for expressing a third color.

Furthermore, the timing controller 11 may receive a control signal for an image. The control signal may include a horizontal synchronization signal, a vertical synchronization signal, and a data enable signal.

The vertical synchronization signal may include pulses. A previous frame period may terminate and a current frame period may start based on a time point at which each pulse occurs. A distance between adjacent pulses of the vertical synchronization signal may correspond to one frame period.

The horizontal synchronization signal may include pulses. A previous horizontal period may terminate and a new horizontal period may start based on a time point at which each pulse occurs. A distance between adjacent pulses of the horizontal synchronization signal may correspond to one horizontal period.

The data enable signal may have an enable level in specific horizontal periods and have a disable level in other periods. In case that the data enable signal is at the enable level, color grayscale signals may be supplied in corresponding horizontal periods.

The timing controller 11 may provide, to the data driver 12, grayscale signals rendered or corrected to meet the specifications of the display device 10. Furthermore, the timing controller 11 may provide a clock signal, a scan start signal, and the like to the scan driver 13.

The data driver 12 may generate data voltages to be provided to data lines DL1 to DLn using the grayscale signals and the control signals that are received from the timing controller 11. For example, the data driver 12 may sample the grayscale signals using a clock signal, and apply data voltages corresponding to the grayscale signals to the data lines DL1 to DLn on a pixel row basis. Here, n may be an integer greater than 0, and the pixel row may refer to pixels connected to the same scan line.

The scan driver 13 may receive a clock signal, a scan start signal, and the like from the timing controller 11, and generate scan signals to be provided to the scan lines GWL1, GRL1, GIL1, EML1, EMBL1, . . . , GWLi, GRLi, GILi, EMLi, EMBLi, . . . , GWLm, GRLm, GILm, EMLm, and EMBLm. Here, m may be an integer greater than 0. For example, the scan driver 13 may include a first sub-scan driver connected to the first scan lines GWL1, . . . , GWLi, . . . , and GWLm, a second sub-scan driver connected to the second scan lines GRL1, . . . , GRLi, . . . , and GRLm, a third sub-scan driver connected to the third scan lines GIL1, . . . , GILi, . . . , and GILm, a fourth sub-scan driver connected to the fourth scan lines EML1, . . . , EMLi, . . . , and EMLm, and a fifth sub-scan driver connected to the fifth scan lines EMBL1, . . . , EMBLi, . . . , and EMBLm.

For example, the first sub-scan driver may sequentially supply scan signals each having a turn-on level pulse to the first scan lines GWL1 to GWLm. For instance, the first sub-scan driver may be configured in the form of a shift register, and may generate scan signals in such a way that a pulse-type scan start signal of a turn-on level is sequentially transmitted to a subsequent stage circuit according to the control of a clock signal. Since the second to fifth sub-scan drivers may also be implemented in substantially the same or similar manner, redundant explanation thereof will be omitted.

The pixel component 14 may include pixels. A pixel PXij may be connected to a corresponding data line, a corresponding scan line, and a corresponding emission line. Here, i and j may each be an integer greater than 0. The pixel PXij may refer to a pixel that is connected to an i-th scan line and a j-th data line.

The pixel component 14 may define a display area. In other words, an area where the pixel component 14 is disposed in the display device 10 may be defined as the display area in which an image is displayed.

The pixel component 14 may include first pixels configured to emit light of a first color, second pixels configured to emit light of a second color, and third pixels configured to emit light of a third color. The first color, the second color, and the third color may be different colors. For example, the first color may be one of red, green, and blue. The second color may be one of red, green, and blue, other than the first color. The third color may be the remaining color among red, green, and blue, other than the first color and the second color. Furthermore, magenta, cyan, and yellow, in lieu of red, green, and blue, may be used as the first to third colors.

The pixel component 14 may have various pixel arrangement structures such as a diamond PENTILE™ structure, a RGB-stripe structure, a S-stripe structure, a real RGB structure, and a normal PENTILE™ structure.

Figure 2:
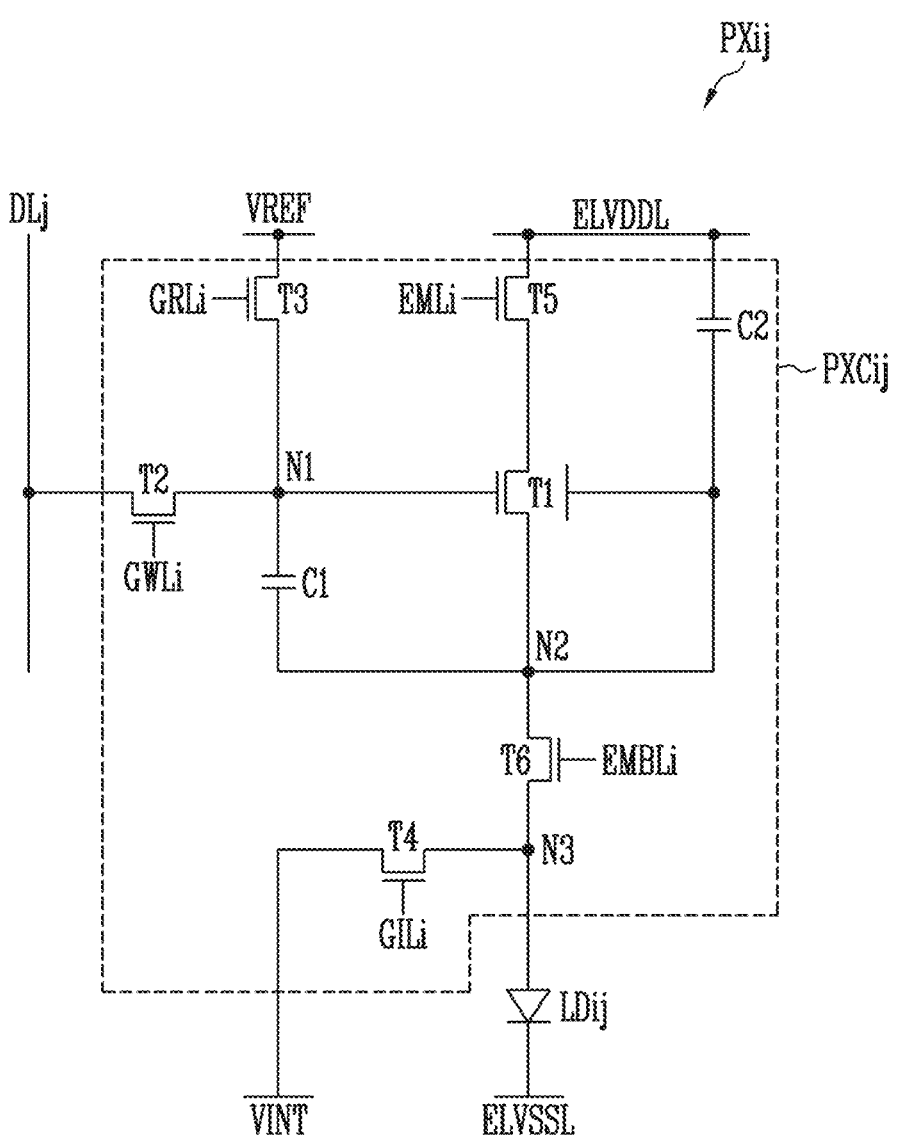
FIG. 2 is a schematic diagram of a circuit illustrating a pixel in accordance with an embodiment of the disclosure.

FIG. 2 is a schematic diagram of a circuit illustrating the pixel PXij in accordance with an embodiment of the disclosure.

Referring to FIG. 2, the pixel PXij may include a pixel circuit PXCij and a light emitting element LDij that is electrically connected to the pixel circuit PXCij.

The pixel circuit PXCij may include at least one transistor and at least one capacitor. For example, the pixel circuit PXCij may include transistors T1, T2, T3, T4, T5, and T6, a storage capacitor C1, and a hold capacitor C2. However, the numbers of transistors and capacitors included in the pixel circuit PXCij are not limited to the aforementioned description. The pixel circuit PXCij may include more or fewer transistors and/or capacitors to meet operation characteristics thereof.

Hereinafter, a circuit configured of N-type transistors will be described. However, those skilled in the art may design a circuit configured of P-type transistors by changing the polarity of the voltage to be applied to a gate terminal of each transistor. Likewise, those skilled in this art may design a circuit configured of a combination of a P-type transistor and an N-type transistor. Here, the P-type transistor is a general term of a transistor in which the amount of current increases as a difference in voltage between the gate electrode and the source electrode increases in a negative direction. The N-type transistor is a general term of a transistor in which the amount of current increases as a difference in voltage between the gate electrode and the source electrode increases in a positive direction. Each transistor may be configured in various forms such as a thin film transistor (TFT), a field effect transistor (FET), and a bipolar junction transistor (BJT).

The following description assumes that the transistors T1, T2, T3, T4, T5, and T6 are configured of N-type oxide thin-film transistors. However, in an embodiment, the transistors T1, T2, T3, T4, T5, and T6 may be formed of P-type silicon thin-film transistors. In an embodiment, some of the transistors T1, T2, T3, T4, T5, and T6 may be formed of N-type oxide thin-film transistors, while others may be formed of P-type silicon thin-film transistors.

An oxide thin-film transistor may correspond to a low temperature polycrystalline oxide (LTPO) thin-film transistor in which a semiconductor layer includes oxide. However, this is only for illustrative purposes, and the N-type transistors are not limited thereto. For example, a semiconductor layer included in the N-type transistor may include an inorganic semiconductor (e.g., amorphous silicon, poly silicon) or an organic semiconductor. The silicon thin-film transistor may correspond to a LTPS thin-film transistor in which the semiconductor layer includes amorphous silicon, poly silicon, or the like.

The first transistor T1 may include an upper gate electrode connected to a first node N1, and a lower gate electrode connected to a second node N2. The lower gate electrode of the first transistor T1 may be provided to adjust characteristics of output current relative to input voltage of the first transistor T1. For example, the first transistor T1 may primarily operate in a saturation state. When it is assumed that the lower gate electrode of the first transistor T1 is not present, the magnitude of the output current may vary depending on changes in a drain-source voltage even though a gate-source voltage remains the same. In accordance with an embodiment, as the characteristics of the first transistor T1 are adjusted to be insensitive to changes in the drain-source voltage, it may be possible for the first transistor T1 to output nearly identical current for the same gate-source voltage. The first transistor T1 may be connected between the first power line ELVDDL and the second power line ELVSSL. The first transistor T1 may control the amount of driving current flowing from a first power line ELVDDL to a second power line ELVSSL. Therefore, the first transistor T1 may be referred to as "driving transistor". The first transistor T1 may include a first electrode connected to a second electrode of the fifth transistor T5, and a second electrode connected to a second node N2.

The second transistor T2 may include a gate electrode connected to the first scan line GWLi, a first electrode connected to the data line DLj, and a second electrode connected to the first node N1. The second transistor T2 may receive a data voltage applied to the data line DLj. Therefore, the second transistor T2 may be referred to as "data writing transistor".

The third transistor T3 may include a gate electrode connected to the second scan line GRLi, a first electrode configured to receive a reference voltage VREF, and a second electrode connected to the first node N1. The reference voltage VREF may be supplied from a reference voltage source (not illustrated). The third transistor T3 may apply the reference voltage VREF to the first node N1 to initialize the voltage of the first node N1 to the reference voltage VREF. Therefore, the third transistor T3 may be referred to as "first initialization transistor".

The fourth transistor T4 may include a gate electrode connected to the third scan line GILi, a first electrode configured to receive an initialization voltage VINT, and a second electrode connected to a third node N3. The initialization voltage VINT may be supplied from an initialization voltage source (not illustrated). The fourth transistor T4 may apply the initialization voltage VINT to the third node N3 to initialize the voltage of the third node N3 to the initialization voltage VINT. Therefore, the fourth transistor T4 may be referred to as "second initialization transistor".

The fifth transistor T5 may include a gate electrode connected to the fourth scan line EMLi, a first electrode connected to the first power line ELVDDL, and a second electrode connected to the first electrode of the first transistor T1. The fifth transistor T5 may control opening and closing of a driving current path connecting the first power line ELVDDL to the second power line ELVSSL. Therefore, the fifth transistor T5 may be referred to as "first emission control transistor".

The sixth transistor T6 may include a gate electrode connected to the fifth scan line EMBLi, a first electrode connected to the second node N2, and a second electrode connected to the third node N3. The sixth transistor T6 may control opening and closing of a driving current path connecting the first power line ELVDDL to the second power line ELVSSL. Therefore, the sixth transistor T6 may be referred to as "second emission control transistor".

The storage capacitor C1 may include a first terminal connected to the first node N1, and a second terminal connected to the second node N2. The hold capacitor C2 may include a first terminal connected to the first power line ELVDDL, and a second terminal connected to the second node N2.

The light emitting element LDij may include an anode connected to the third node N3, and a cathode connected to the second power line ELVSSL. The light emitting element LDij may be a light emitting diode. The light emitting element LDij may be formed of an organic light emitting diode, an inorganic light emitting diode, a quantum dot/well light emitting diode, or the like. Although in an embodiment only one light emitting element LDij is provided in each pixel, multiple light emitting elements may be provided in each pixel in other embodiments. The light emitting elements may be connected in series, parallel, series-parallel, or the like. The light emitting element LDij of each pixel may emit light having one of a first color, a second color, and a third color.

A first power voltage may be applied to the first power line ELVDDL. A second power voltage may be applied to the second power line ELVSSL. For example, the first power voltage may be greater than the second power voltage.

Figure 3:
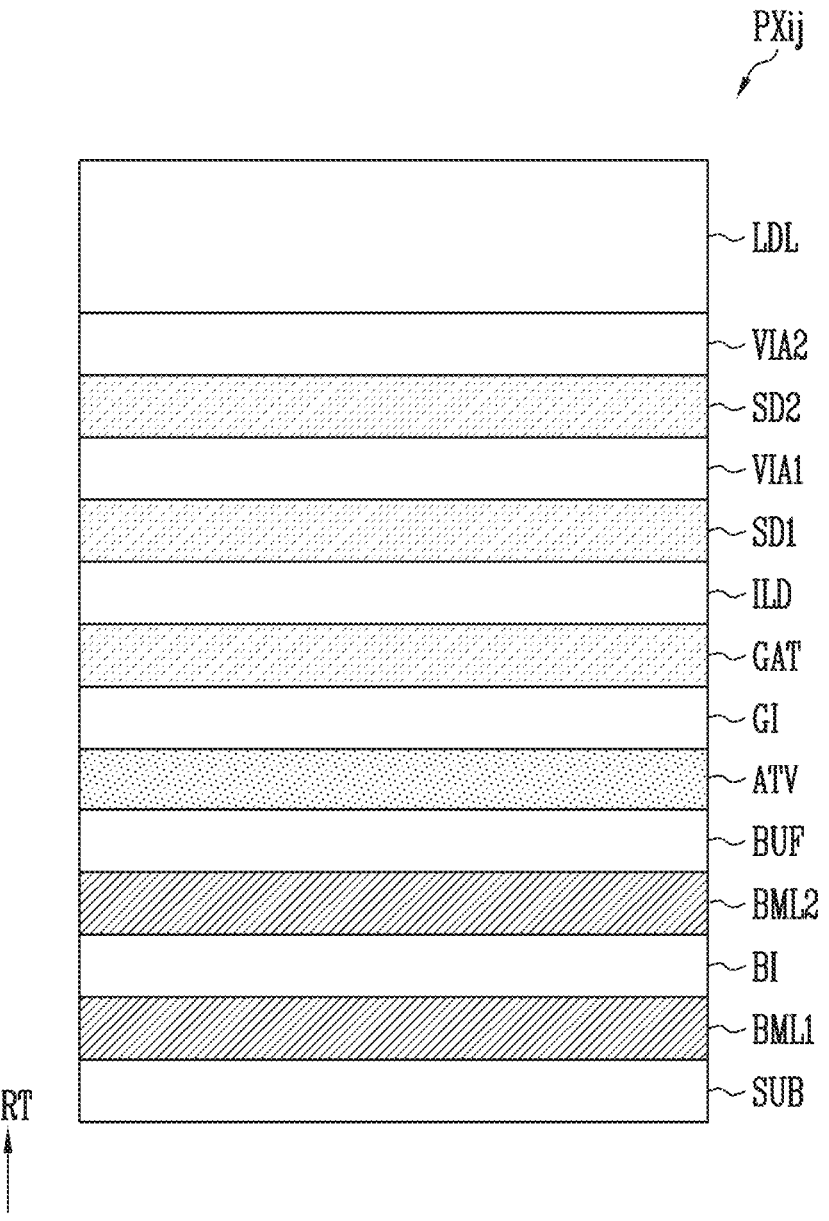
FIG. 3 is a schematic diagram illustrating various components included in the pixel of FIG. 2.

FIG. 3 is a schematic diagram illustrating various components included in the pixel of FIG. 2.

Referring to FIG. 3, the pixel PXij may include a substrate SUB, a first bottom conductive layer BML1, a BI insulating layer BI, a second bottom conductive layer BML2, a buffer layer BUF, a semiconductor layer ATV, a gate insulating layer GI, a gate conductive layer GAT, an interlayer insulating layer ILD, a first source-drain (SD) conductive layer SD1, a first via insulating layer VIA1, a second source-drain (SD) conductive layer SD2, a second via insulating layer VIA2, and a light emitting element layer LDL that are stacked on each other in a thickness direction DRT.

The substrate SUB may be rigid or flexible. For example, the substrate SUB may include glass or plastic.

The BI insulating layer BI, the buffer layer BUF, the gate insulating layer GI, and the interlayer insulating layer ILD may include inorganic insulating material. For example, the BI insulating layer BI, the buffer layer BUF, the gate insulating layer GI, and the interlayer insulating layer ILD may each independently include silicon nitride, silicon oxide, and/or silicon oxynitride. The BI insulating layer BI, the buffer layer BUF, the gate insulating layer GI, and the interlayer insulating layer ILD may each independently have a multilayer structure in which the aforementioned materials are stacked on each other in the thickness direction DRT.

The first and second via insulating layers VIA1 and VIA2 may include organic insulating material. For example, the first and second via insulating layers VIA1 and VIA2 may each independently include at least one of acrylic resin, epoxy resin, phenolic resin, polyamide resin, polyimide rein, unsaturated polyester resin, poly-phenylene ether resin, poly-phenylene sulfide resin, and benzocyclobutene resin.

The first and second bottom conductive layers BML1 and BML2, the semiconductor layer ATV, the gate conductive layer GAT, the first SD conductive layer SD1, and the second SD conductive layer SD2 may form the pixel circuit PXCij. For example, the transistors (refer to T1 to T6 of FIG. 2), the lines (refer to GWLi, GRLi, GILi, EMLi, EMBLI, ELVDDL, ELVSSL, DLj, and the like of FIG. 2), the capacitors (refer to C1 and C2 of FIG. 2), and electrodes (or lines) connecting the lines and the transistors and/or the capacitors may be implemented using the first and second bottom conductive layers BML1 and BML2, the semiconductor layer ATV, the gate conductive layer GAT, the first SD conductive layer SD1, and the second SD conductive layer SD2. According to electrical connection relationships between the respective components in the circuit diagram illustrated in FIG. 2, the conductive layers BML1, BML2, GAT, SD1, and SD2 and the semiconductor layer ATV may be electrically connected to each other through through holes defined in the insulating layers BI, BUF, GI, ILD, VIA1, and VIA2.

The light-emitting-element layer LDL may be disposed on the second via insulating layer VIA2. The light-emitting-element layer LDL may include a light emitting element LDij. The light emitting element LDij may be electrically connected to the pixel circuit PXCij. For example, the light emitting element LDij may be electrically connected to the second SD conductive layer SD2 through a through hole defined in the second via insulating layer VIA2, and may thus be electrically connected to the pixel circuit PXCij.

In FIG. 3, there has been described an embodiment where the pixel circuit PXCij is implemented using the five conductive layers BML1, BML2, GAT, SD1, and SD2 and the single semiconductor layer ATV. However, the numbers of conductive layers and semiconductor layers provided to implement the pixel circuit PXCij are not limited to the aforementioned description. Those skilled in the art will be able to design the pixel circuit PXCij by appropriately changing the arrangement, numbers, or the like of conductive layers and semiconductor layers.

Figure 4:
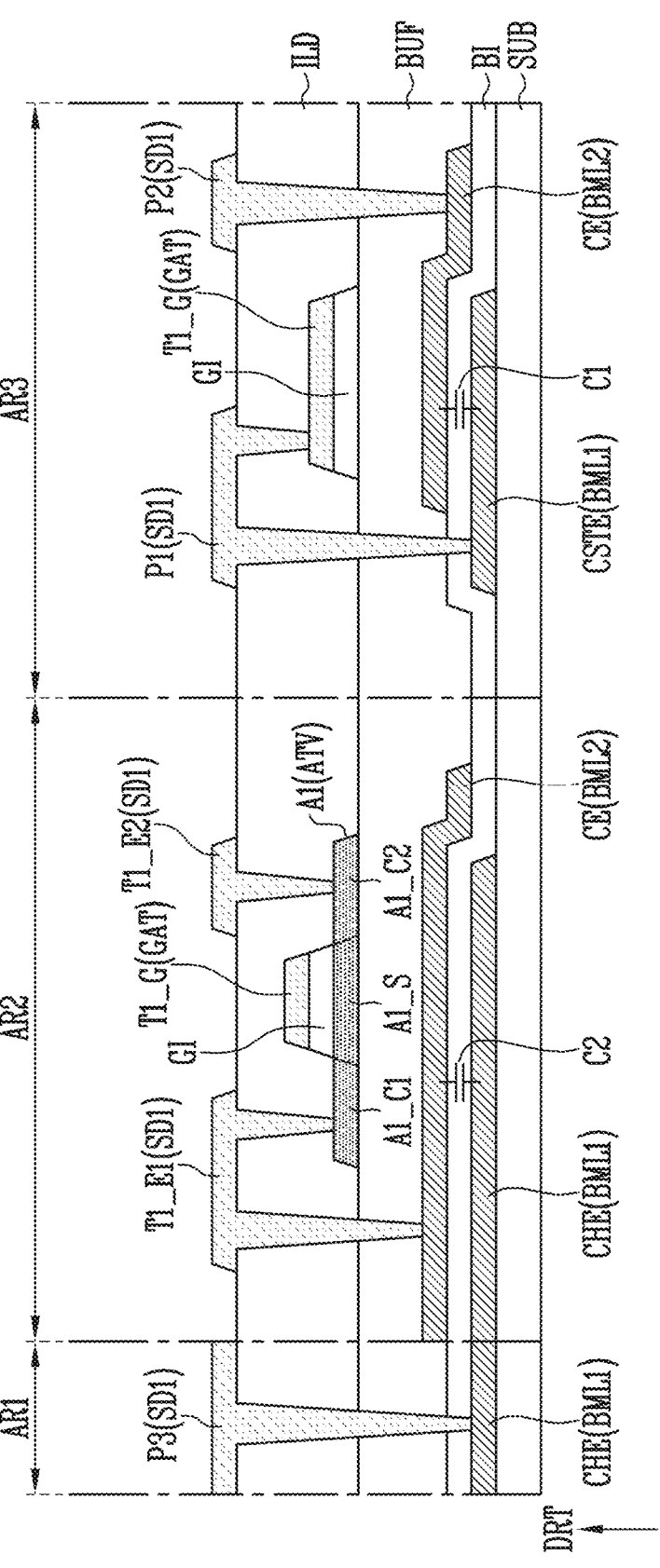
FIG. 4 is a schematic sectional view illustrating an embodiment in which a first transistor, a first capacitor, and a second capacitor of FIG. 2 are implemented using the various components illustrated in FIG. 3.

FIG. 4 is a schematic sectional view illustrating an embodiment in which the first transistor, the first capacitor, and the second capacitor of FIG. 2 are implemented using the various components illustrated in FIG. 3. In FIG. 4, for clear and concise description, the first via insulating layer VIA1 and the components disposed on the first via insulating layer VIA1 are omitted.

Referring to FIG. 4, a first area AR1, a second area AR2, and a third area AR3 may each independently be some areas among areas where the pixel circuit PXCij described with reference to FIG. 2 is disposed.

The first bottom conductive layer BML1 may include multiple first bottom conductive patterns. For example, the first bottom conductive patterns may include a first lower capacitor electrode CSTE and a second lower capacitor electrode CHE. However, the first bottom conductive patterns are not limited to the aforementioned description. The first bottom conductive patterns may further include various conductive patterns provided to implement the pixel circuit PXCij described with reference to FIG. 2.

The first lower capacitor electrode CSTE may function as the first terminal of the storage capacitor C1 (refer to FIG. 2). The first lower capacitor electrode CSTE may be disposed in the third area AR3.

The second lower capacitor electrode CHE may function as the first terminal of the hold capacitor C2 (refer to FIG. 2). The second lower capacitor electrode CHE may be disposed in the first area AR1 and the second area AR2.

The first lower capacitor electrode CSTE and the second lower capacitor electrode CHE may be spaced apart from each other. In other words, the first lower capacitor electrode CSTE and the second lower capacitor electrode CHE may not directly contact each other.

The second bottom conductive layer BML2 may include multiple second bottom conductive patterns. For example, the second bottom conductive patterns may include an upper capacitor electrode CE. However, the first bottom conductive patterns are not limited to the aforementioned description. The second bottom conductive patterns may further include various conductive patterns provided to implement the pixel circuit PXCij described with reference to FIG. 2.

The upper capacitor electrode CE may overlap the first lower capacitor electrode CSTE in the third area AR3. The upper capacitor electrode CE may function as the second terminal of the storage capacitor C1 (refer to FIG. 2) in the third area AR3.

The upper capacitor electrode CE may overlap the second lower capacitor electrode CHE in the second area AR2. The upper capacitor electrode CE may function as the second terminal of the hold capacitor C2 (refer to FIG. 2) in the second area AR2.

Although in FIG. 4 there is illustrated the case where the upper capacitor electrode CE is disposed in each of the second area AR2 and the third area AR3, the upper capacitor electrode CE disposed in the second area AR2 and the upper capacitor electrode CE disposed in the third area AR3 may extend to other areas that are not illustrated in FIG. 4 and be connected to each other to form an integrated structure.

The semiconductor layer ATV may include multiple semiconductor patterns. For example, the semiconductor patterns may include a first semiconductor pattern A1. However, the semiconductor patterns are not limited to the aforementioned description. The semiconductor patterns may further include various semiconductor patterns provided to implement the pixel circuit PXCij described with reference to FIG. 2.

The first semiconductor pattern A1 may include a first semiconductor portion A1_S, and first and second conductive portions A1_C1 and A1_C2 adjacent to opposite sides of the first semiconductor portion A1_S.

The first conductive portion A1_C1 and the second conductive portion A1_C2 may be portions having relatively high conductivity in the first semiconductor pattern A1. For example, the first conductive portion A1_C1 and the second conductive portion A1_C2 may be portions that are conductive by being exposed to etching particles during a dry etching process for patterning the gate conductive layer GAT. The first conductive portion A1_C1 and the second conductive portion A1_C2 may function as electrodes, lines, or the like. For example, the first conductive portion A1_C1 may function as the first electrode of the first transistor T1 (refer to FIG. 2). The second conductive portion A1_C2 may function as the second electrode of the first transistor T1 (refer to FIG. 2).

The first semiconductor portion A1_S may have properties of a semiconductor. For example, the first semiconductor portion A1_S may be a portion that is not substantially exposed to the etching particles during the dry etching process for patterning the gate conductive layer GAT. The first semiconductor portion A1_S may function as a channel of the transistor. For example, the first semiconductor portion A1_S may function as a channel of the first transistor T1 (refer to FIG. 2).

The first semiconductor pattern A1 may be disposed in the second area AR2. In the second area AR2, the upper capacitor electrode CE overlapping the first semiconductor portion A1_S may function as the lower gate electrode of the first transistor T1 (refer to FIG. 2).

The gate conductive layer GAT may include multiple gate conductive patterns. For example, the gate conductive patterns may include a first gate conductive pattern T1_G. However, the gate conductive patterns are not limited to the aforementioned description. The gate conductive patterns may further include various conductive patterns provided to implement the pixel circuit PXCij described with reference to FIG. 2.

The first gate conductive pattern T1_G may overlap the first semiconductor portion A1_S in the second area AR2. In the second area AR2, the first gate conductive pattern T1_G may function as the upper gate electrode of the first transistor T1 (refer to FIG. 2).

The first gate conductive pattern T1_G may also be disposed in the third area AR3. The first gate conductive pattern T1_G may not overlap the semiconductor layer ATV in the third area AR3.

Although in FIG. 4 there is illustrated the case where the first gate conductive pattern T1_G is disposed in each of the second area AR2 and the third area AR3, the first gate conductive pattern T1_G disposed in the second area AR2 and the first gate conductive pattern T1_G disposed in the third area AR3 may extend to other areas that are not illustrated in FIG. 4 and be connected to each other to form an integrated structure.

The first SD conductive layer SD1 may include multiple first source-drain (SD) conductive patterns. For example, the first SD conductive patterns may include a first pattern P1, a second pattern P2, a third pattern P3, a first electrode pattern T1_E1, and a second electrode pattern T1_E2. However, the first SD conductive patterns are not limited to the aforementioned description. The first SD conductive patterns may further include various conductive patterns provided to implement the pixel circuit PXCij described with reference to FIG. 2.

The first electrode pattern T1_E1 may electrically contact the first conductive portion A1_C1 and the upper capacitor electrode CE in the second area AR2. Accordingly, the first conductive portion A1_C1 and the upper capacitor electrode CE may be electrically connected to each other through the first electrode pattern T1_E1. The first electrode pattern T1_E1 may be regarded as defining the second node N2 (refer to FIG. 2).

The second electrode pattern T1_E2 may electrically contact the second conductive portion A1_C2 in the second area AR2. The second electrode pattern T1_E2 may extend to other areas that are not shown in FIG. 4, and be electrically connected to the second electrode (not illustrated) of the fifth transistor T5 (refer to FIG. 2).

The first pattern P1 may electrically contact the first gate conductive pattern T1_G and the first lower capacitor electrode CSTE in the third area AR3. Therefore, the first gate conductive pattern T1_G and the first lower capacitor electrode CSTE may be electrically connected to each other by the first pattern P1. The first pattern P1 may be regarded as defining the first node N1 (refer to FIG. 2).

The second pattern P2 may electrically contact the upper capacitor electrode CE in the third area AR3. The second pattern P2 may extend to other areas that are not shown in FIG. 4, and be electrically connected to the first electrode (not illustrated) of the sixth transistor T6 (refer to FIG. 2).

The third pattern P3 may electrically contact the second lower capacitor electrode CHE in the first area AR1. The third pattern P3 may function as the first power line ELVDDL described with reference to FIG. 2, or may extend to other areas that are not illustrated in FIG. 4 and be thus electrically connected to the first power line ELVDDL.

The first pattern P1, the second pattern P2, the third pattern P3, the first electrode pattern T1_E1, and the second electrode pattern T1_E2 may be disposed to be spaced apart from each other. In other words, the first pattern P1, the second pattern P2, the third pattern P3, the first electrode pattern T1_E1, and the second electrode pattern T1_E2 may not directly contact each other.

Figure 5:
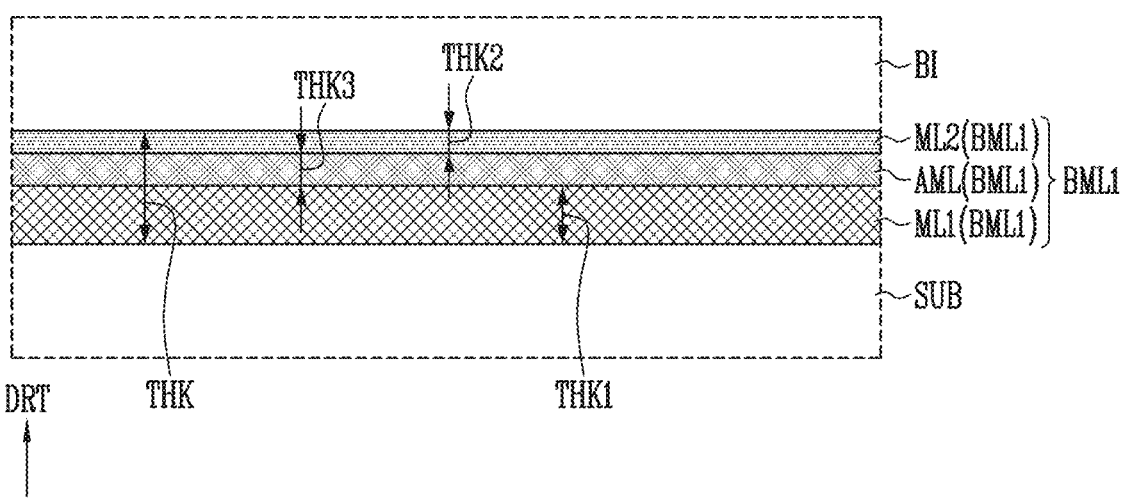
FIG. 5 is a schematic sectional view illustrating an embodiment of a first bottom conductive layer of FIG. 4.

FIG. 5 is a schematic sectional view illustrating an embodiment of a first bottom conductive layer of FIG. 4.

Referring to FIGS. 4 and 5, the first bottom conductive layer BML1 may include a first metal layer ML1, an alloy layer AML, and a second metal layer ML2 that are stacked on each other in the thickness direction DRT. Each of the first bottom conductive patterns (e.g., CHE and CSTE of FIG. 4) included in the first bottom conductive layer BML1 may have a stacked structure including the first metal layer ML1, the alloy layer AML, and the second metal layer ML2 illustrated in FIG. 5.

The first metal layer ML1 may include a first metal material having relatively high conductivity. The second metal layer ML2 may have a second metal material with relatively lower conductivity compared to the first metal layer ML1, but with higher reliability. For example, the first metal layer ML1 may include aluminum (Al), and the second metal layer ML2 may include titanium (Ti). The alloy layer AML may include an alloy of the first metal material and the second metal material. For example, the alloy layer AML may include a TiAl alloy.

The first metal layer ML1 may have a first thickness THK1 in the thickness direction DRT. The second metal layer ML2 may have a second thickness THK2 in the thickness direction DRT. The alloy layer AML may have a third thickness THK3 in the thickness direction DRT.

Since the alloy layer AML and the second metal layer ML2 are disposed on the first metal layer ML1, a hillock may not occur in the first metal layer ML1. Therefore, the reliability of the first bottom conductive layer BML1 may be enhanced.

Figure 6:
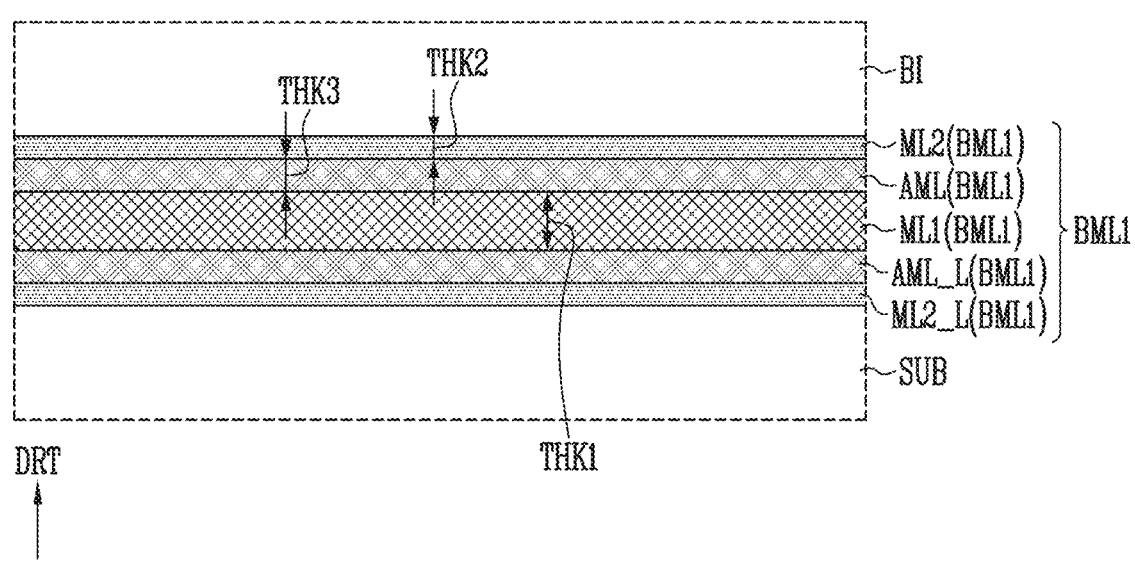
FIG. 6 is a schematic sectional view illustrating an embodiment of the first bottom conductive layer of FIG. 4.

FIG. 6 is a schematic sectional view illustrating an embodiment of the first bottom conductive layer of FIG. 4.

Referring to FIG. 6, the first bottom conductive layer BML1 may include a second lower metal layer ML2_L, a lower alloy layer AML_L, a first metal layer ML1, an alloy layer AML, and a second metal layer ML2 that are stacked on each other in the thickness direction DRT. Each of the first bottom conductive patterns (e.g., CHE and CSTE of FIG. 4) included in the first bottom conductive layer BML1 may have a stacked structure including the second lower metal layer ML2_L, the lower alloy layer AML_L, the first metal layer ML1, the alloy layer AML, and the second metal layer ML2 illustrated in FIG. 6.

The first metal layer ML1, the alloy layer AML, and the second metal layer ML2 may be configured as described with reference to FIG. 5. Hereinafter, repetitive explanations will be omitted.

The second lower metal layer ML2_L may include substantially the same material as the second metal layer ML2. The second lower metal layer ML2_L may have substantially the same (or similar) thickness as the second thickness THK2.

The lower alloy layer AML_L may include substantially the same material as the alloy layer AML. The lower alloy layer AML_L may have substantially the same (or similar) thickness as the third thickness THK3.

Since the second lower metal layer ML2_L and the lower alloy layer AML_L are disposed under the first metal layer ML1, a hillock may not occur in a lower surface of the first metal layer ML1. Therefore, the reliability of the first bottom conductive layer BML1 may be enhanced.

Figure 7:
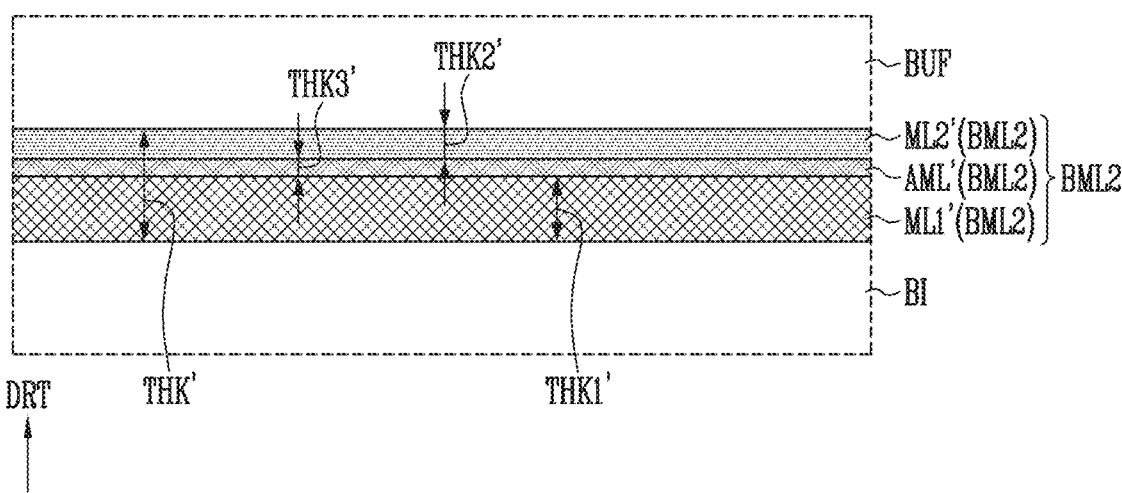
FIG. 7 is a schematic sectional view illustrating an embodiment of a second bottom conductive layer of FIG. 4.

FIG. 7 is a schematic sectional view illustrating an embodiment of the second bottom conductive layer BML2 of FIG. 4.

Referring to FIGS. 4 and 7, the second bottom conductive layer BML2 may include a first metal layer ML1', an alloy layer AML', and a second metal layer ML2' that are stacked on each other in the thickness direction DRT. Each of the second bottom conductive patterns (e.g., CE of FIG. 4) included in the second bottom conductive layer BML2 may have a stacked structure including the first metal layer ML1', the alloy layer AML', and the second metal layer ML2' illustrated in FIG. 7.

The first metal layer ML1' may include substantially the same material as the first metal layer ML1 described with reference to FIG. 5. The second metal layer ML2' may include substantially the same material as the second metal layer ML2 described with reference to FIG. 5. The alloy layer AML' may include substantially the same material as the alloy layer AML described with reference to FIG. 5.

The first metal layer ML1' may have a first thickness THK1' in the thickness direction DRT. The second metal layer ML2' may have a second thickness THK2' in the thickness direction DRT. The alloy layer AML' may have a third thickness THK3' in the thickness direction DRT.

Since the alloy layer AML' and the second metal layer ML2' are disposed on the first metal layer ML1', a hillock may not occur in the first metal layer ML1'. Therefore, the reliability of the second bottom conductive layer BML2 may be enhanced.

Referring again to FIGS. 5 and 7, the third thickness THK3 of the alloy layer AML in the first bottom conductive layer BML1 may be greater than the third thickness THK3' of the alloy layer AML' in the second bottom conductive layer BML2. For example, the third thickness THK3 may be greater than approximately 100 nanometers and less than approximately 150 nanometers, and the third thickness THK3' may be greater than approximately 50 nanometers and less than approximately 100 nanometers.

In embodiments, an overall thickness THK of the first bottom conductive layer BML1 may be substantially the same as an overall thickness THK' of the second bottom conductive layer BML2. The first thickness THK1 of the first metal layer ML1 in the first bottom conductive layer BML1 may be less than the first thickness THK1' of the first metal layer ML1' in the second bottom conductive layer BML2. The second thickness THK2 of the second metal layer ML2 in the first bottom conductive layer BML1 may be less than the second thickness THK2' of the second metal layer ML2' in the second bottom conductive layer BML2.

Figure 8:
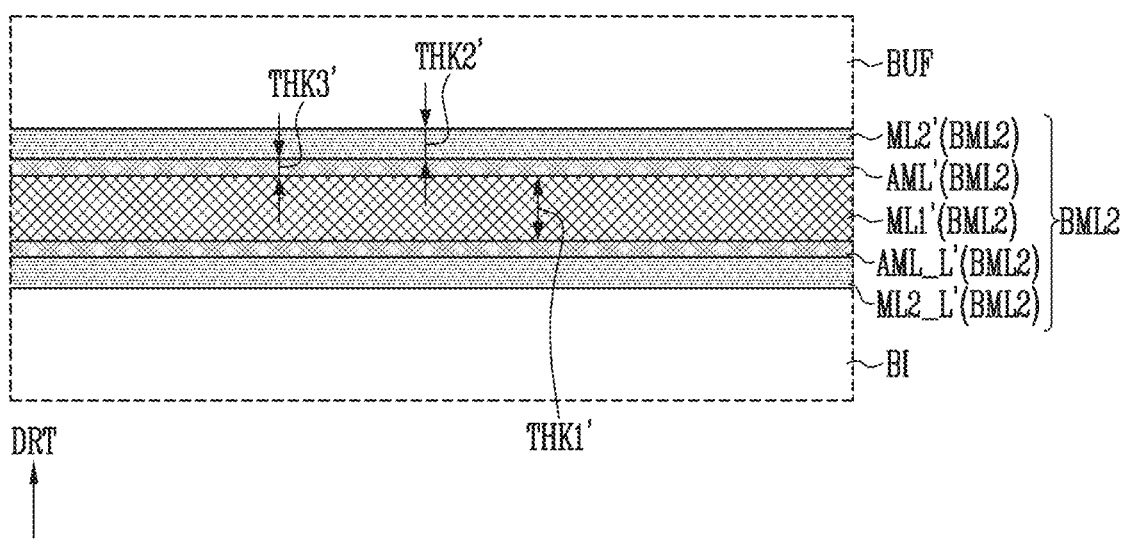
FIG. 8 is a schematic sectional view illustrating an embodiment of the second bottom conductive layer of FIG. 4.

FIG. 8 is a schematic sectional view illustrating an embodiment of the second bottom conductive layer of FIG. 4.

Referring to FIG. 8, the second bottom conductive layer BML2 may include a second lower metal layer ML2_L', a lower alloy layer AML_L', a first metal layer ML1', an alloy layer AML', and a second metal layer ML2' that are stacked on each other in the thickness direction DRT. Each of the second bottom conductive patterns (e.g., CE of FIG. 4) included in the second bottom conductive layer BML2 may have a stacked structure including the second lower metal layer ML2_L', the lower alloy layer AML_L', the first metal layer ML1', the alloy layer AML', and the second metal layer ML2' illustrated in FIG. 8.

The first metal layer ML1', the alloy layer AML', and the second metal layer ML2' may be configured as described with reference to FIG. 7. Hereinafter, repetitive explanations will be omitted.

The second lower metal layer ML2_L' may include substantially the same material as the second metal layer ML2'. The second lower metal layer ML2_L' may have substantially the same (or similar) thickness as the second thickness THK2'.

The lower alloy layer AML_L' may include substantially the same material as the alloy layer AML. The lower alloy layer AML_L' may have substantially the same (or similar) thickness as the third thickness THK3'.

Since the second lower metal layer ML2_L' and the lower alloy layer AML_L' are disposed under the first metal layer ML1', a hillock may not occur in a lower surface of the first metal layer ML1'. Therefore, the reliability of the second bottom conductive layer BML2 may be enhanced.

Figure 9:
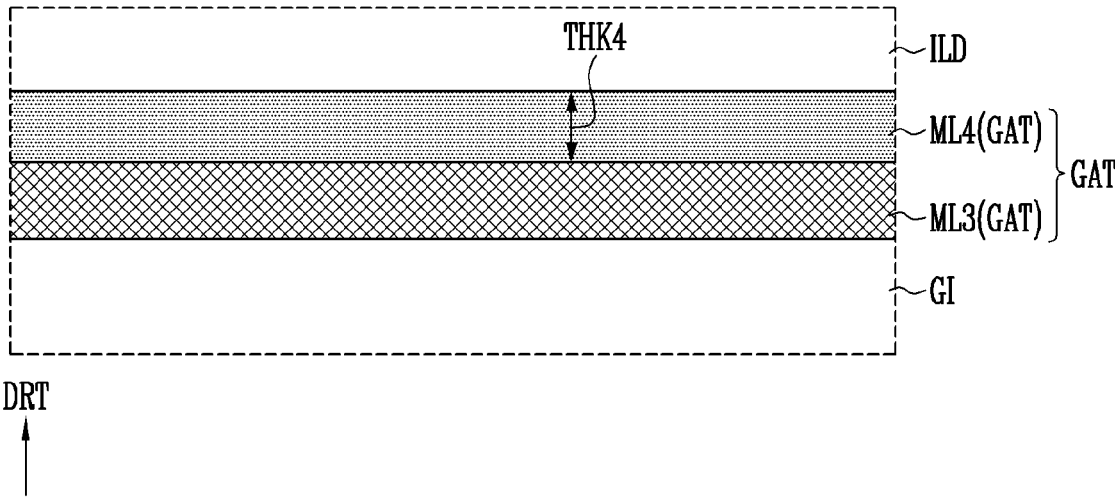
FIG. 9 is a schematic sectional view illustrating an embodiment of a gate conductive layer of FIG. 4.

FIG. 9 is a schematic sectional view illustrating an embodiment of a gate conductive layer of FIG. 4.

Referring to FIGS. 4 and 9, the gate conductive layer GAT may include a third metal layer ML3 and a fourth metal layer ML4 that are stacked on each other in the thickness direction DRT. Each of the gate conductive patterns (e.g., T1_G of FIG. 4) included in the gate conductive layer GAT may have a stacked structure including the third metal layer ML3 and the fourth metal layer ML4 illustrated in FIG. 9.

The third metal layer ML3 may include a third metal material having relatively high conductivity. The fourth metal layer ML4 may have a fourth metal material with relatively lower conductivity compared to the third metal layer ML3, but with higher reliability. For example, the third metal layer ML3 may include aluminum (Al), and the fourth metal layer ML4 may include titanium (Ti).

As illustrated in FIG. 9, an alloy layer may not be interposed between the third metal layer ML3 and the fourth metal layer ML4. In other words, the third metal layer ML3 and the fourth metal layer ML4 may directly contact each other.

Referring again to FIGS. 4 to 9, the gate conductive layer GAT may not include the alloy layer AML or AML'. To prevent a hillock from occurring in the third metal layer ML3, the fourth metal layer ML4 may have a relatively large thickness. For example, the fourth thickness THK4 of the fourth metal layer ML4 may be greater than the second thickness THK2 described with reference to FIG. 5. For example, the fourth thickness THK4 of the fourth metal layer ML4 may be greater than the second thickness THK2' described with reference to FIG. 7.

Figure 10:
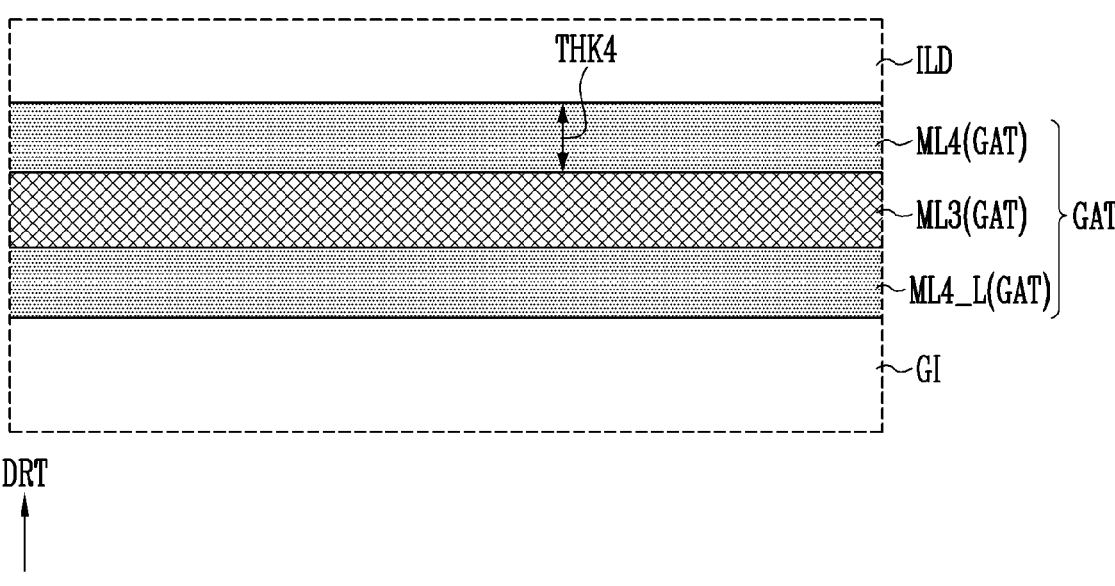
FIG. 10 is a schematic sectional view illustrating an embodiment of the gate conductive layer of FIG. 4.

FIG. 10 is a schematic sectional view illustrating an embodiment of the gate conductive layer GAT of FIG. 4.

Referring to FIGS. 4 and 10, the gate conductive layer GAT may include a fourth lower metal layer ML4_L, a third metal layer ML3, and a fourth metal layer ML4 that are stacked on each other in the thickness direction DRT. Each of the gate conductive patterns (e.g., T1_G of FIG. 4) included in the gate conductive layer GAT may have a stacked structure including the fourth lower metal layer ML4_L, the third metal layer ML3, and the fourth metal layer ML4 illustrated in FIG. 10.

The third metal layer ML3 and the fourth metal layer ML4 may be configured as described with reference to FIG. 9. Hereinafter, repetitive explanations will be omitted.

The fourth lower metal layer ML4_L may include substantially the same material as the fourth metal layer ML4. The fourth lower metal layer ML4_L may have substantially the same (or similar) thickness as the fourth thickness THK4.

Figure 11:
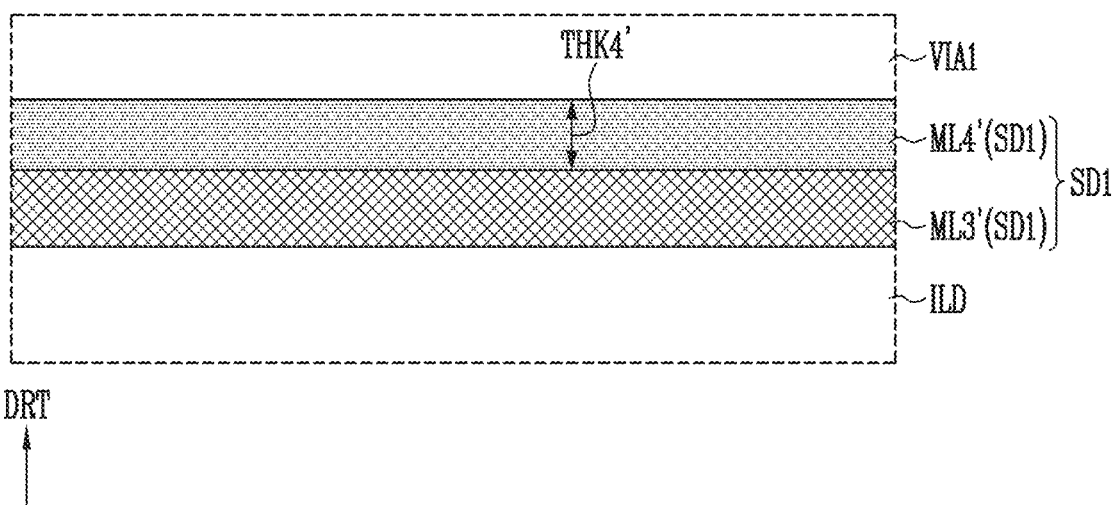
FIG. 11 is a schematic sectional view illustrating an embodiment of a first SD conductive layer of FIG. 4.

FIG. 11 is a schematic sectional view illustrating an embodiment of the first SD conductive layer SD1 of FIG. 4.

Referring to FIGS. 4 and 11, the first SD conductive layer SD1 may include a third metal layer ML3' and a fourth metal layer ML4' that are stacked on each other in the thickness direction DRT. Each of the first SD conductive patterns (e.g., T1_E1, T1_E2, P1, P2, and P3 of FIG. 4) included in the first SD conductive layer SD1 may have a stacked structure including the third metal layer ML3' and the fourth metal layer ML4' illustrated in FIG. 11.

The third metal layer ML3' may include substantially the same material as the third metal layer ML3 described with reference to FIG. 9. The fourth metal layer ML4' may include substantially the same material as the fourth metal layer ML4 described with reference to FIG. 9.

As illustrated in FIG. 11, an alloy layer may not be interposed between the third metal layer ML3' and the fourth metal layer ML4'. In other words, the third metal layer ML3' and the fourth metal layer ML4' may directly contact each other.

Referring again to FIGS. 4 to 8 and 11, the first SD conductive layer SD1 may not include the alloy layer AML or AML'. To prevent a hillock from occurring in the third metal layer ML3', the fourth metal layer ML4' may have a relatively large thickness. For example, the fourth thickness THK4' of the fourth metal layer ML4' may be greater than the second thickness THK2 described with reference to FIG. 5. For example, the fourth thickness THK4' of the fourth metal layer ML4' may be greater than the second thickness THK2' described with reference to FIG. 7.

Figure 12:
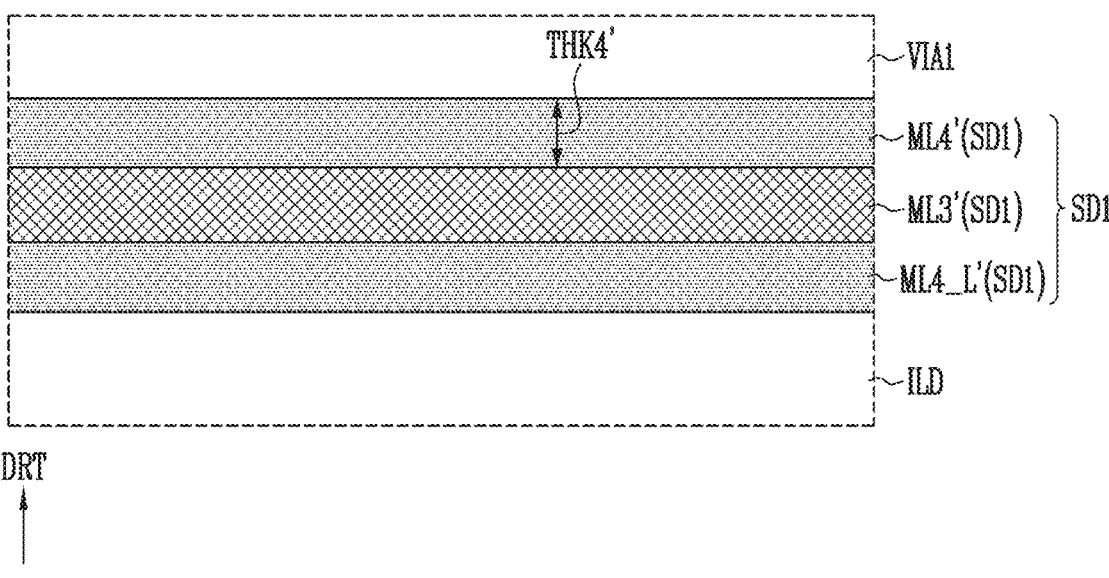
FIG. 12 is a schematic sectional view illustrating an embodiment of the first SD conductive layer of FIG. 4.

FIG. 12 is a schematic sectional view illustrating an embodiment of the first SD conductive layer SD1 of FIG. 4.

Referring to FIGS. 4 and 12, the first SD conductive layer SD1 may include a fourth lower metal layer ML4_L', a third metal layer ML3', and a fourth metal layer ML4' that are stacked on each other in the thickness direction DRT. Each of the first SD conductive patterns (e.g., T1_E1, T1_E2, P1, P2, and P3 of FIG. 4) included in the first SD conductive layer SD1 may have a stacked structure including the fourth lower metal layer ML4_L', the third metal layer ML3' and the fourth metal layer ML4' illustrated in FIG. 12.

The third metal layer ML3' and the fourth metal layer ML4' may be configured as described with reference to FIG. 11. Therefore, repetitive explanations will be omitted.

The fourth lower metal layer ML4_L' may include substantially the same material as the fourth metal layer ML4'. The fourth lower metal layer ML4_L' may have substantially the same (or similar) thickness as the fourth thickness THK4'.

The second SD conductive layer SD2 may be configured in substantially the same or similar manner as the first SD conductive layer SD1 and/or the gate conductive layer GAT described with reference to FIGS. 9 to 12.

Figure 13:
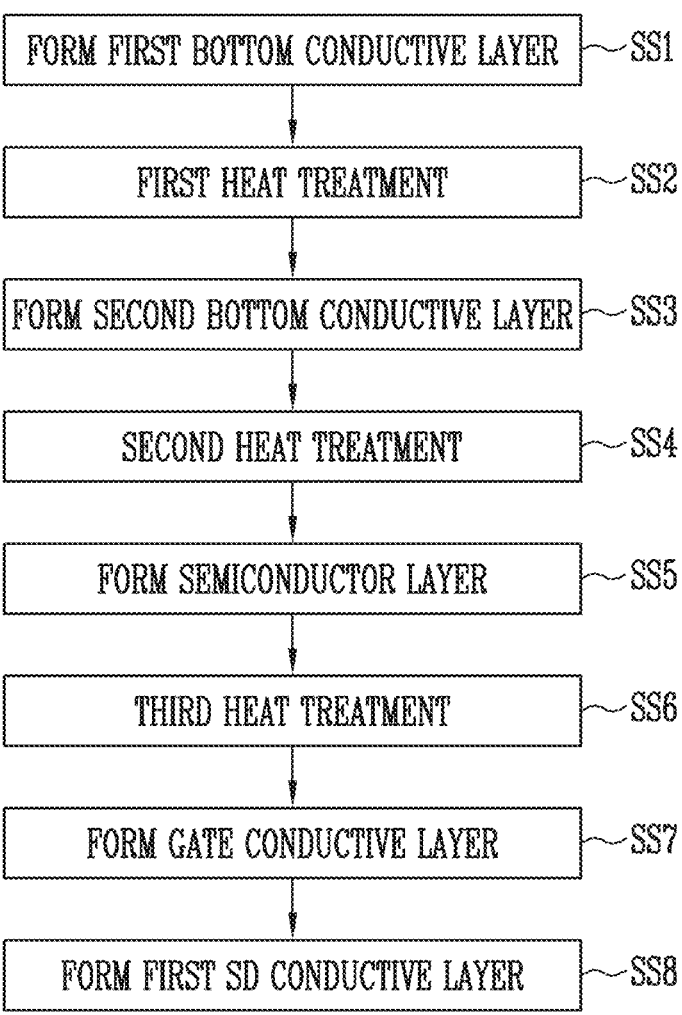
FIG. 13 is a flowchart of a method of fabricating the pixel in accordance with embodiments of the disclosure.

FIG. 13 is a flowchart of a method of fabricating the pixel in accordance with embodiments of the disclosure. FIGS. 14 to 29 are schematic diagrams illustrating a method of fabricating the pixel PXij in accordance with embodiments of the disclosure. Hereinafter, descriptions of contents overlapping those described with reference to FIGS. 1 to 12 will be omitted.

Referring to FIG. 13, the method of fabricating the pixel PXij may include step SS1 of forming the first bottom conductive layer BML1, a first heat treatment step SS2, step SS3 of forming the second bottom conductive layer BML2, a second heat treatment step SS4, step SS5 of forming the semiconductor layer ATV, a third heat treatment step SS6, step SS7 of forming the gate conductive layer GAT, and step SS8 of forming the first SD conductive layer SD1.

Figure 14:
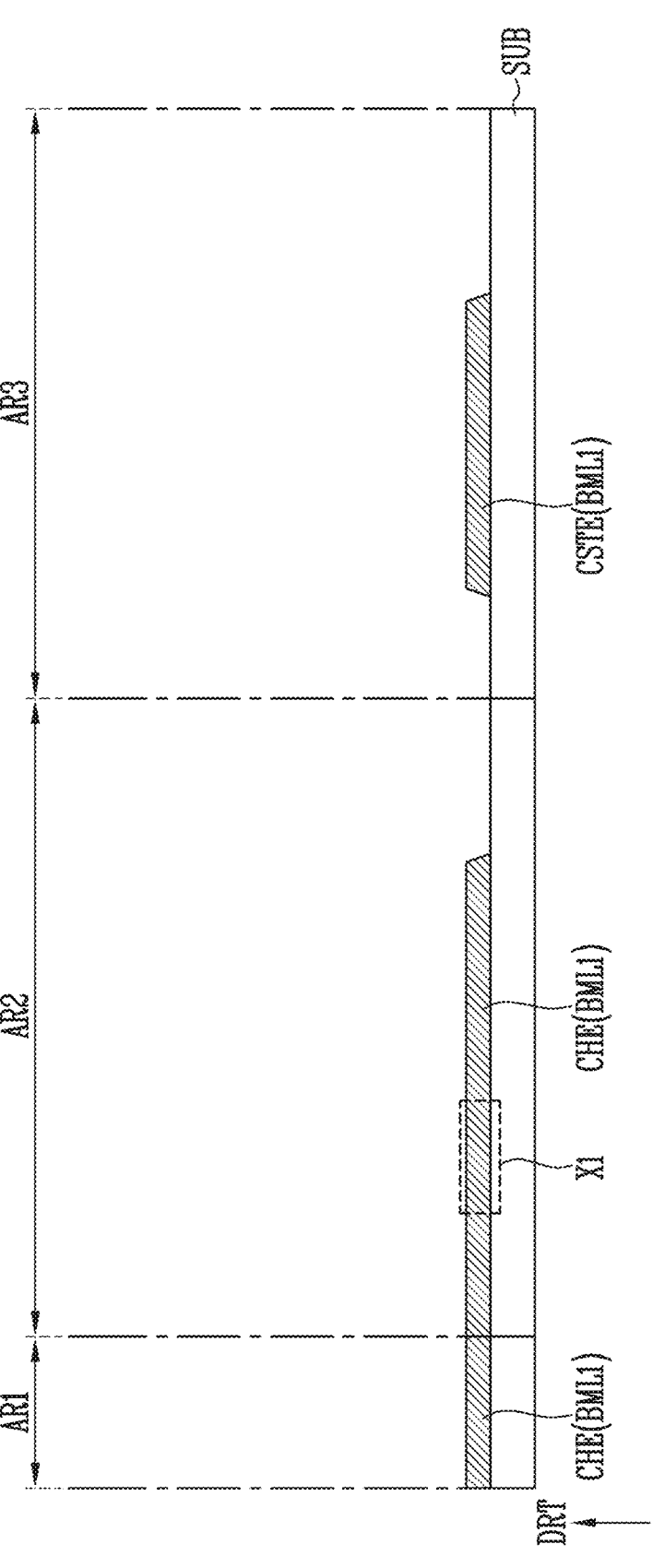
FIGS. 14 to 29 are schematic diagrams illustrating a method of fabricating the pixel in accordance with embodiments of the disclosure.

Referring to FIG. 14, the first bottom conductive layer BML1 may be formed on the substrate SUB (at step SS1). The first bottom conductive layer BML1 may include multiple first bottom conductive patterns. For example, the first bottom conductive layer BML1 may include a first lower capacitor electrode CSTE and a second lower capacitor electrode CHE.

Figure 15:
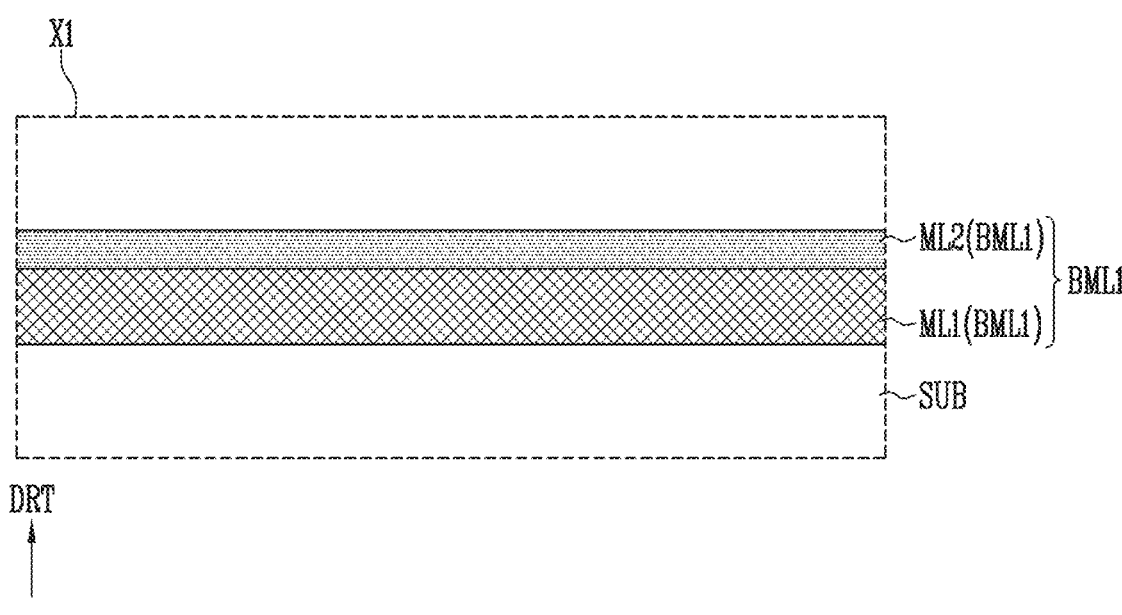

Referring to FIG. 15, there is illustrated an enlargement of area X1 of FIG. 14. At step SS1, the first bottom conductive layer BML1 may include a first metal layer ML1 and a second metal layer ML2 that are stacked on each other in the thickness direction DRT. Here, an alloy layer may not be substantially present between the first metal layer ML1 and the second metal layer ML2. In other words, the first metal layer ML1 may directly contact the second metal layer ML2.

Figure 16:
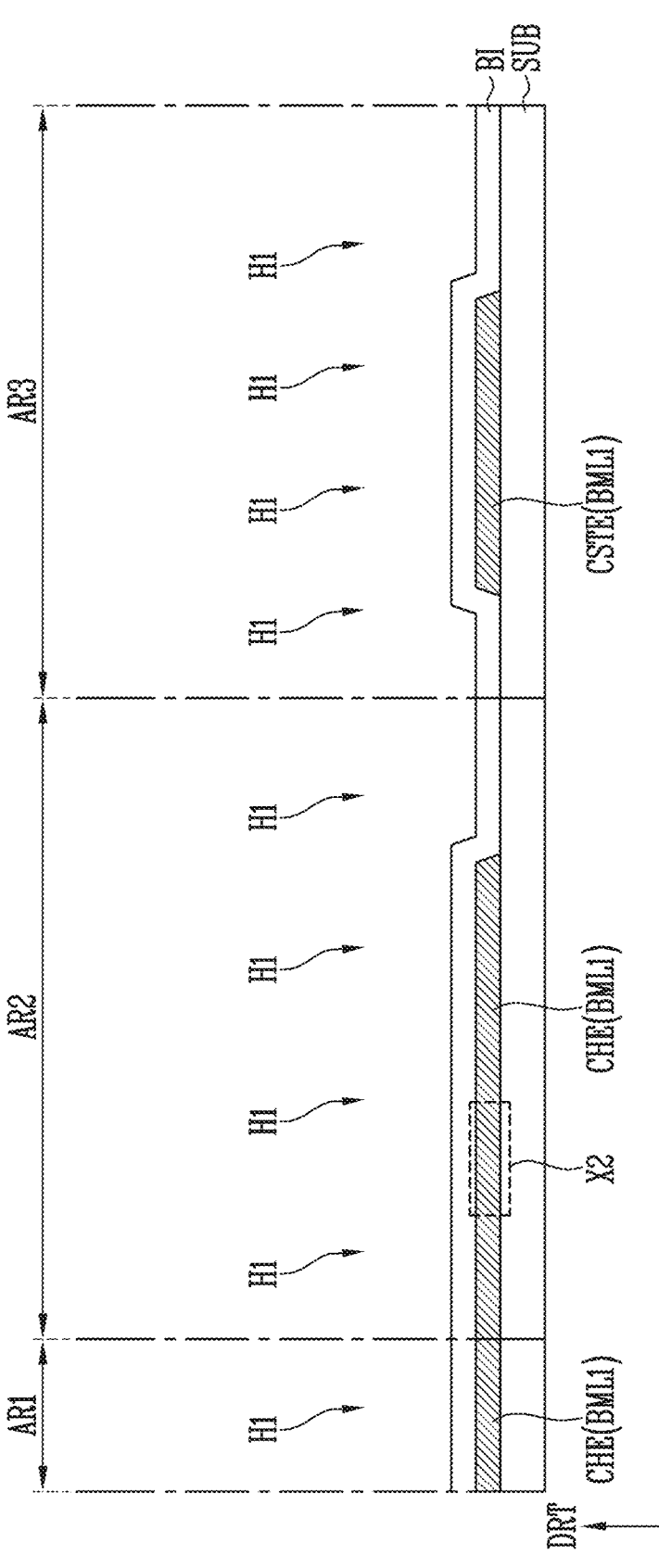

Referring to FIG. 16, to cover the first bottom conductive layer BML1, the BI insulating layer BI may be formed on the substrate SUB. Subsequently, first heat treatment H1 may be performed (at step SS2). The first heat treatment H1 may be performed at approximately 350° C. or more, but the disclosure is not limited thereto. For example, the first heat treatment H1 may be performed at a temperature sufficient for the first metal material included in the first metal layer ML1 and the second metal material included in the second metal layer ML2 to react and form an alloy.

Figure 17:
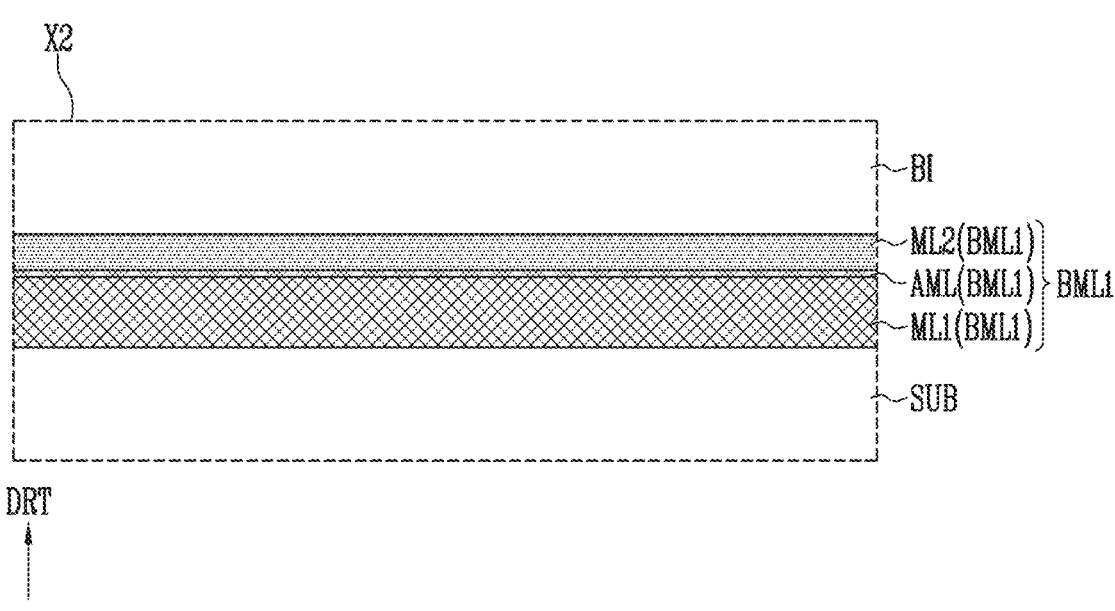

Referring to FIG. 17, there is illustrated an enlargement of area X2 of FIG. 16. By the first heat treatment H1, the first metal material and the second metal material may react at an interface between the first metal layer ML1 and the second metal layer ML2 to form an alloy. Accordingly, the alloy layer AML may be formed between the first metal layer ML1 and the second metal layer ML2.

Figure 18:
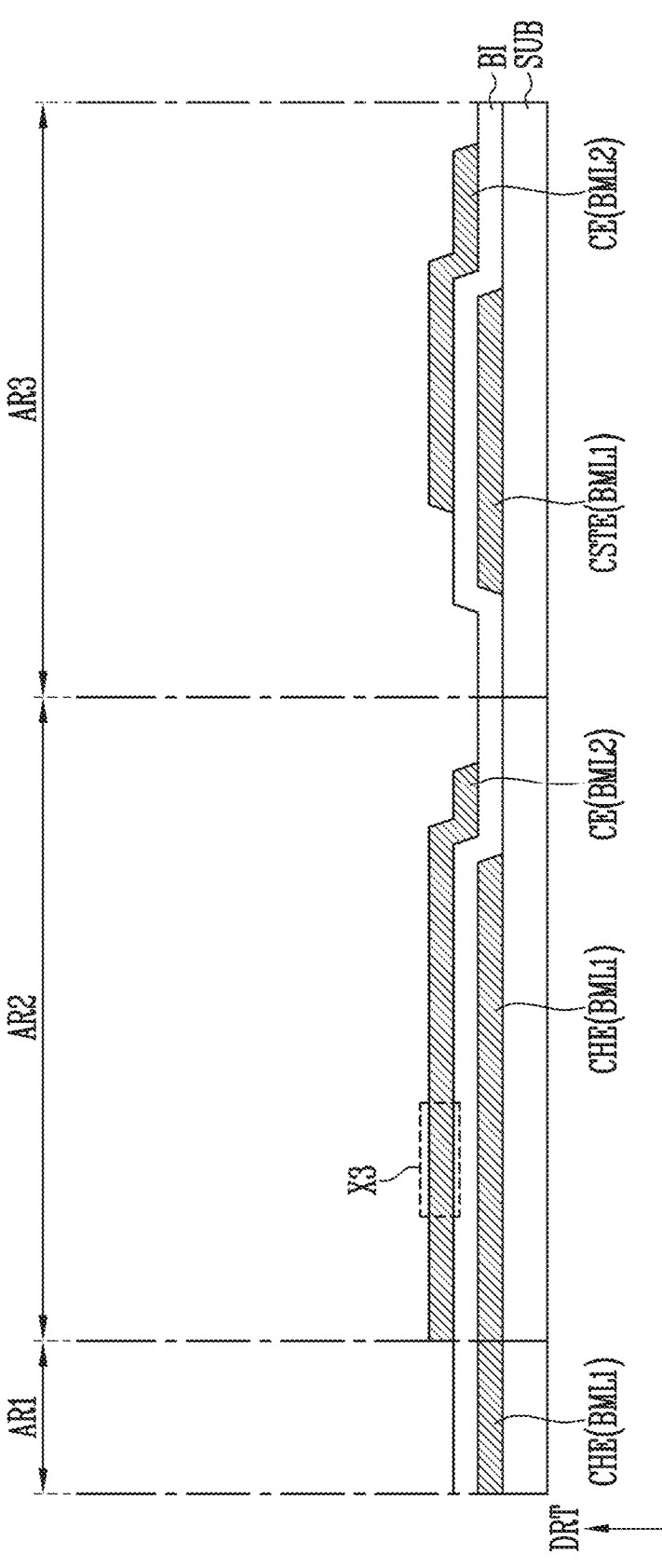

Referring to FIG. 18, the second bottom conductive layer BML2 may be formed on the BI insulating layer BI (at step SS3). The second bottom conductive layer BML2 may include multiple second bottom conductive patterns. For example, the second bottom conductive layer BML2 may include an upper capacitor electrode CE.

Figure 19:
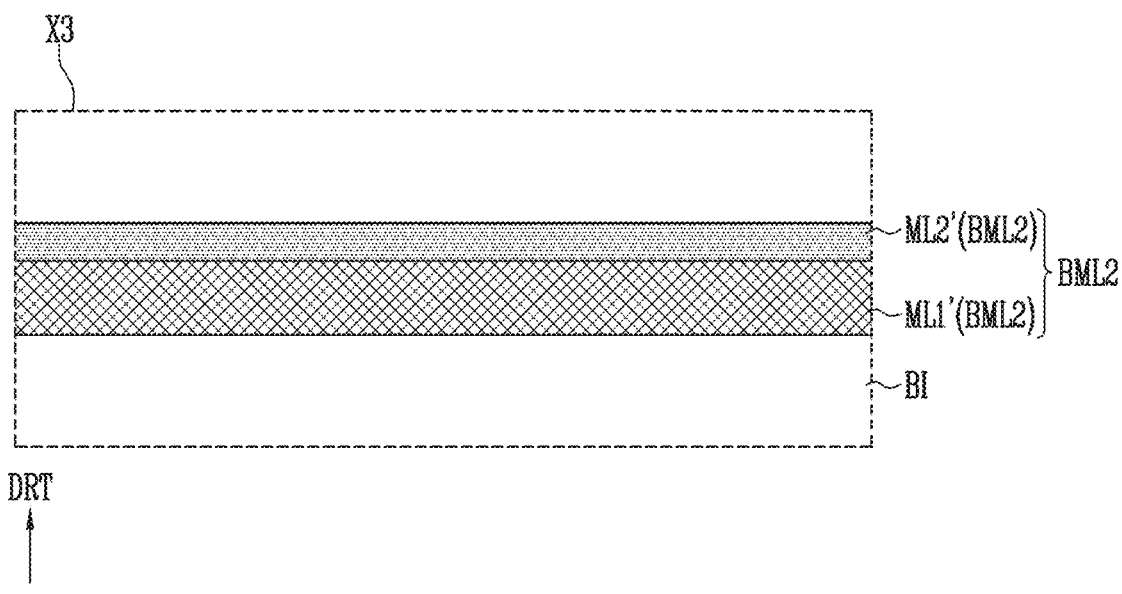

Referring to FIG. 19, there is illustrated an enlargement of area X3 of FIG. 18. At step SS3, the second bottom conductive layer BML2 may include a first metal layer ML1' and a second metal layer ML2' that are stacked on each other in the thickness direction DRT. Here, an alloy layer may not be substantially present between the first metal layer ML1' and the second metal layer ML2'. In other words, the first metal layer ML1' may directly contact the second metal layer ML2'.

Figure 20:
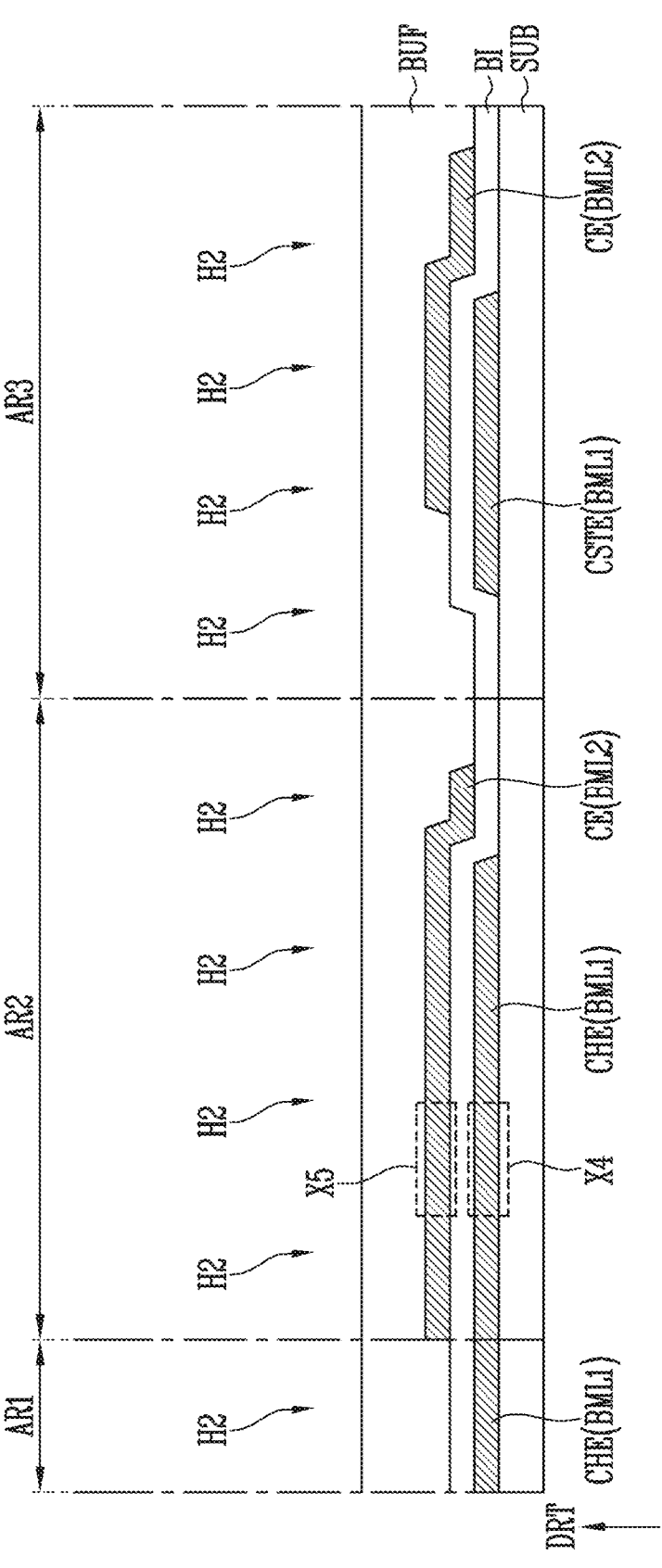

Referring to FIG. 20, to cover the second bottom conductive layer BML2, the buffer layer BUF may be formed on the BI insulating layer BI. Thereafter, second heat treatment H2 may be performed (at step SS4). The second heat treatment H2 may be performed at approximately 350° C. or more, but the disclosure is not limited thereto. For example, the second heat treatment H2 may be performed at a temperature sufficient for the first metal material included in the first metal layer ML1 or ML1' and the second metal material included in the second metal layer ML2 or ML2' to react and form an alloy.

Figure 21:
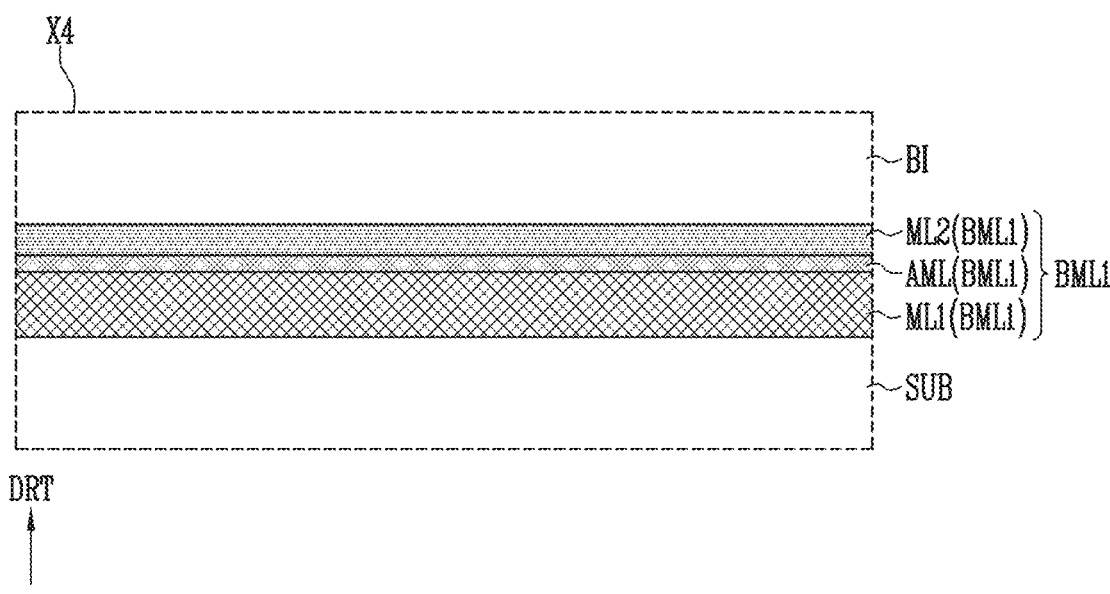

Referring to FIG. 21, there is illustrated an enlargement of area X4 of FIG. 20. By the second heat treatment H2, the first metal material of the first metal layer ML1 and the second metal material of the second metal layer ML2 may react and form an alloy. Therefore, the thickness of the alloy layer AML may increase. In other words, compared to the thickness of the alloy layer AML described with reference to FIG. 17 in the thickness direction DRT, the thickness of the alloy layer AML illustrated in FIG. 21 in the thickness direction DRT may be greater.

Figure 22:
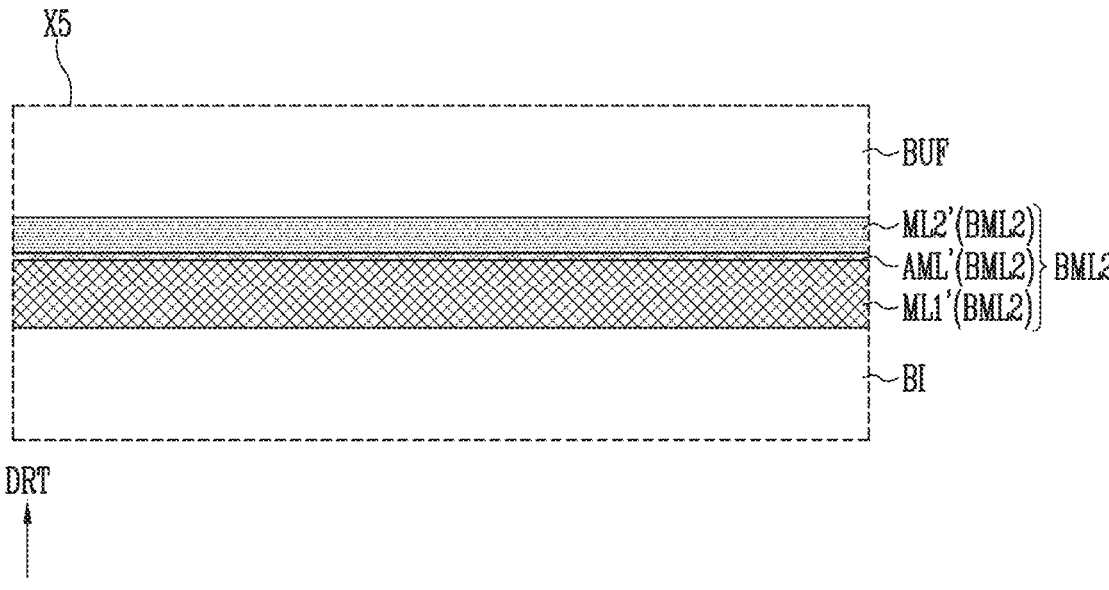

Referring to FIG. 22, there is illustrated an enlargement of area X5 of FIG. 20. By the second heat treatment H2, the first metal material and the second metal material may react at an interface between the first metal layer ML1' and the second metal layer ML2' to form an alloy. Accordingly, the alloy layer AML' may be formed between the first metal layer ML1' and the second metal layer ML2'.

Figure 23:
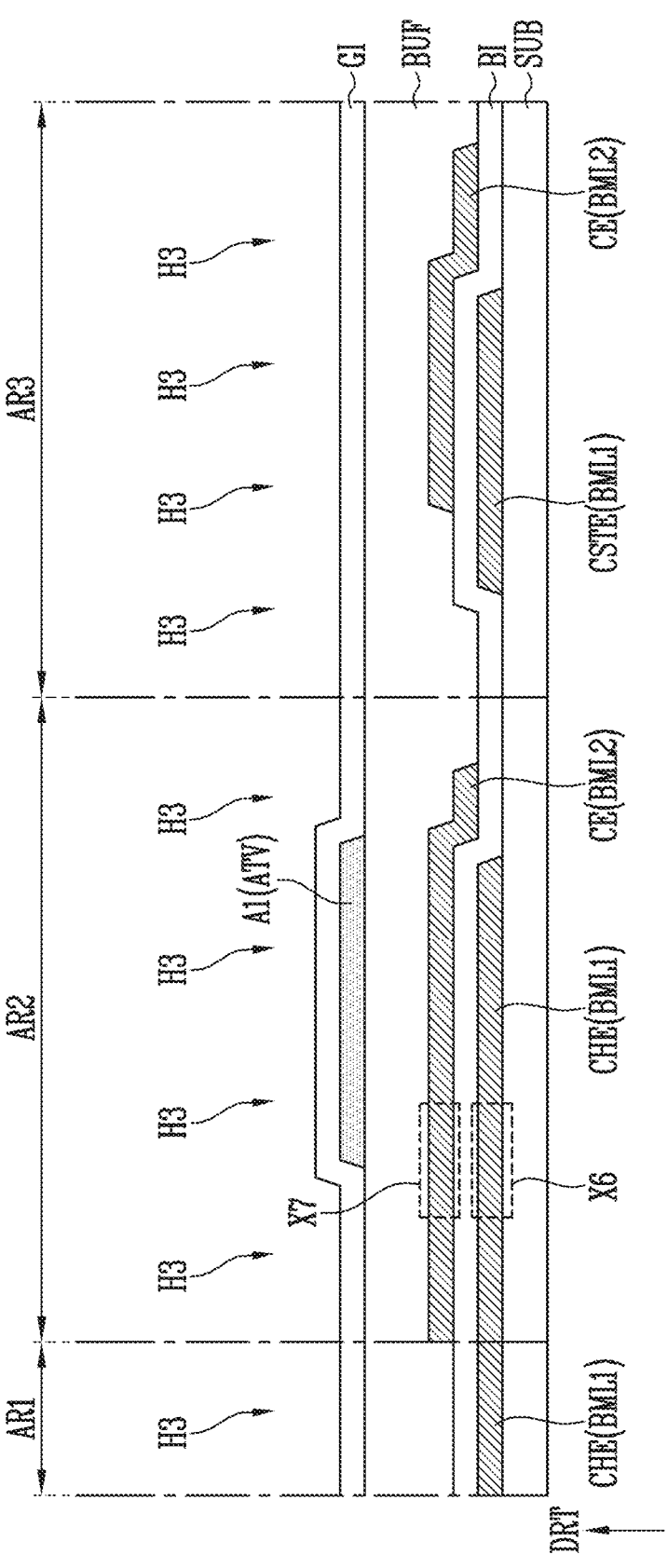

Referring to FIG. 23, the semiconductor layer ATV may be formed (at step SS5). The semiconductor layer ATV may include a semiconductor patterns. For example, the semiconductor layer ATV may include a first semiconductor pattern A1.

Thereafter, to cover the semiconductor layer ATV, the gate insulating layer GI may be formed on the buffer layer BUF. Subsequently, third heat treatment H3 may be performed (at step SS6). The third heat treatment H3 may be performed at approximately 350° C. or more, but the disclosure is not limited thereto. For example, the third heat treatment H3 may be performed at a temperature sufficient for the first metal material included in the first metal layer ML1 or ML1' and the second metal material included in the second metal layer ML2 or ML2' to react and form an alloy.

Figure 24:
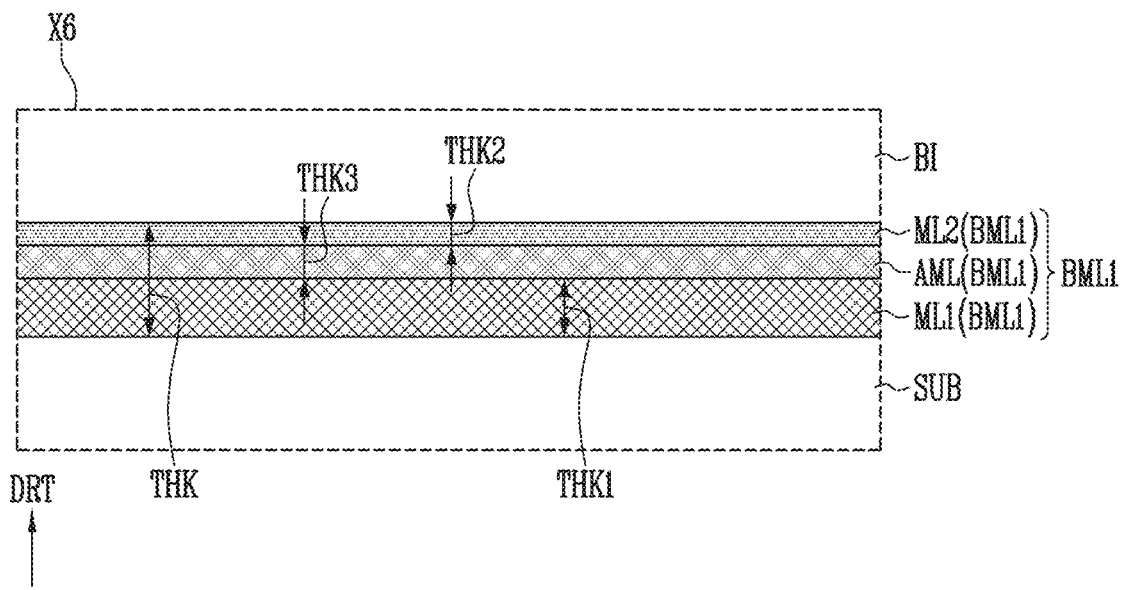

Referring to FIG. 24, there is illustrated an enlargement of area X6 of FIG. 23. By the third heat treatment H3, the first metal material of the first metal layer ML1 and the second metal material of the second metal layer ML2 may react and form an alloy. Therefore, the thickness of the alloy layer AML may increase. In other words, compared to the thickness of the alloy layer AML described with reference to FIG. 21 in the thickness direction DRT, the third thickness THK3 of the alloy layer AML illustrated in FIG. 24 may be greater.

Figure 25:
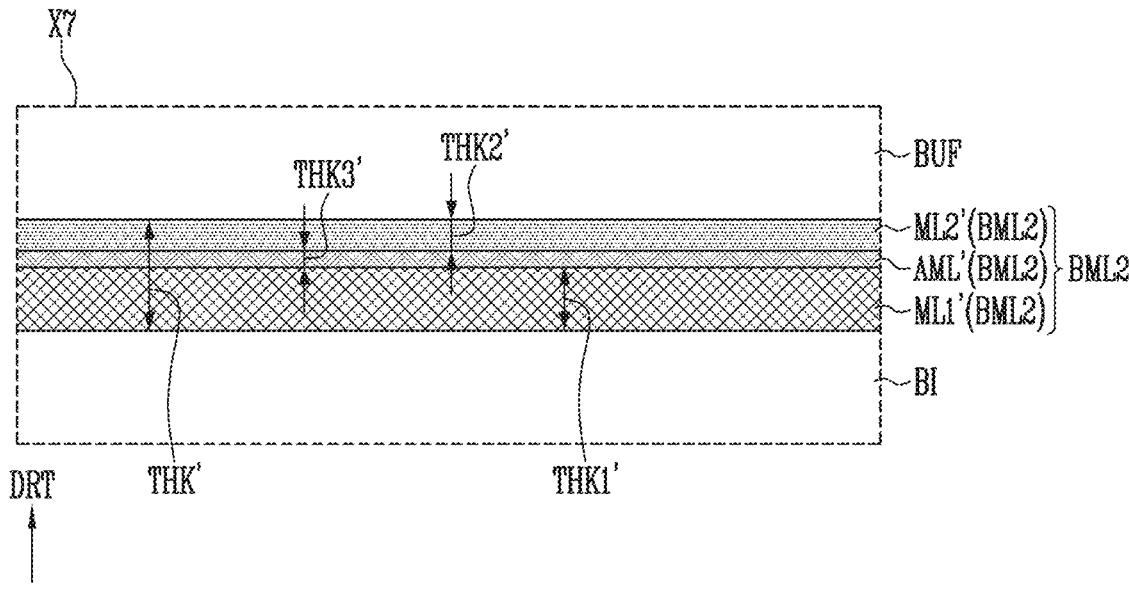

Referring to FIG. 25, there is illustrated an enlargement of area X7 of FIG. 23. By the third heat treatment H3, the first metal material of the first metal layer ML1' and the second metal material of the second metal layer ML2' may react and form an alloy. Therefore, the thickness of the alloy layer AML' may increase. In other words, compared to the thickness of the alloy layer AML' described with reference to FIG. 22 in the thickness direction DRT, the third thickness THK3' of the alloy layer AML' illustrated in FIG. 25 may be greater.

Referring again to FIGS. 24 and 25, three heat treatments H1, H2, and H3 may be performed on the first bottom conductive layer BML1, and two heat treatments H2, and H3 may be performed on the second bottom conductive layer BML2. Therefore, a relatively large amount of alloy may be formed in the first bottom conductive layer BML1, and a relatively small amount of alloy may be formed in the second bottom conductive layer BML2. In other words, the third thickness THK3 of the alloy layer AML in the first bottom conductive layer BML1 may be greater than the third thickness THK3' of the alloy layer AML' in the second bottom conductive layer BML2.

Figure 26:
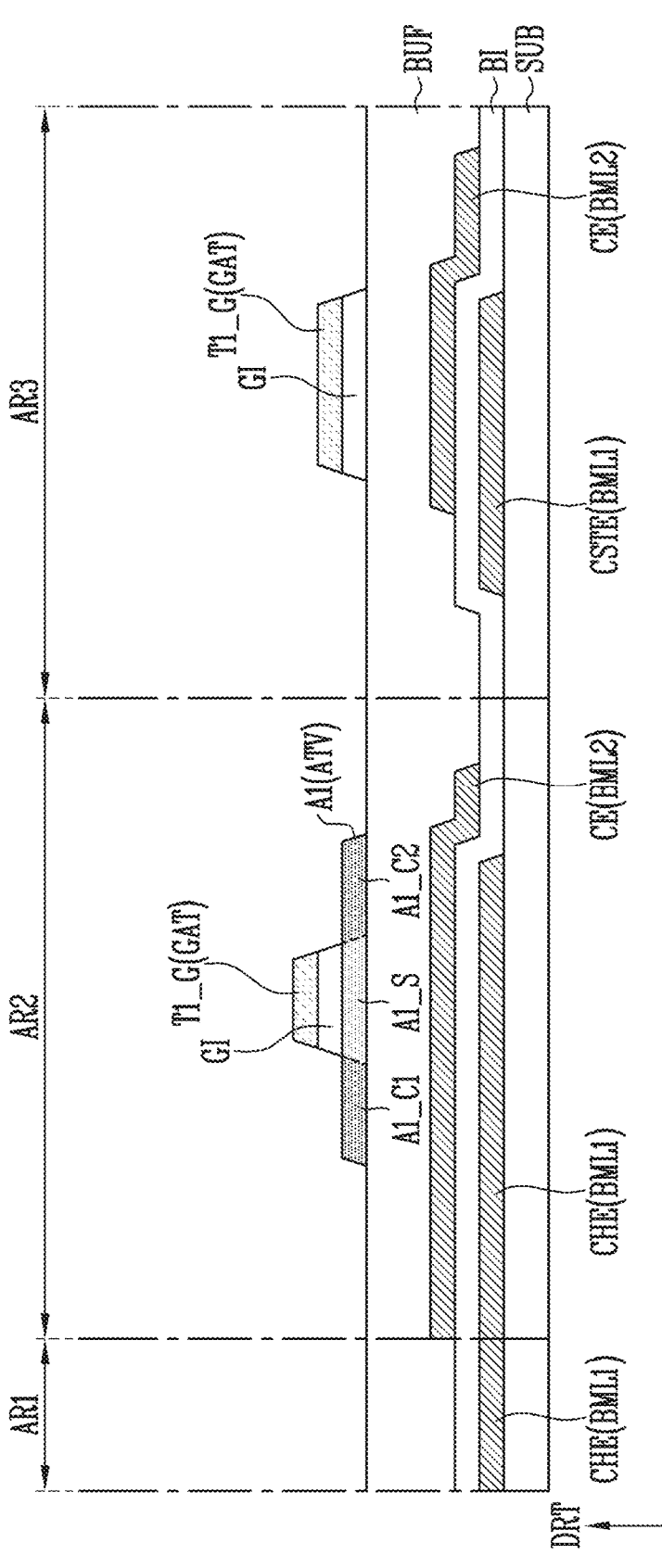

Referring to FIG. 26, after the gate insulating layer GI is formed, the gate conductive layer GAT may be formed (at step SS7). The gate conductive layer GAT may include multiple gate conductive patterns. For example, the gate conductive layer GAT may include a first gate conductive pattern T1_G.

At the present step, the gate insulating layer GI may be patterned in a shape corresponding to the gate conductive patterns included in the gate conductive layer GAT. For example, dry etching may be performed using the gate conductive patterns as a mask. The gate insulating layer GI may be patterned by the dry etching. As the dry etching is performed, portions of the semiconductor layer ATV that do not overlap the gate conductive patterns may become conductive. For example, the first and second conductive portions A1_C1 and A1_C2 of the first semiconductor pattern A1 may become conductive.

Figure 27:
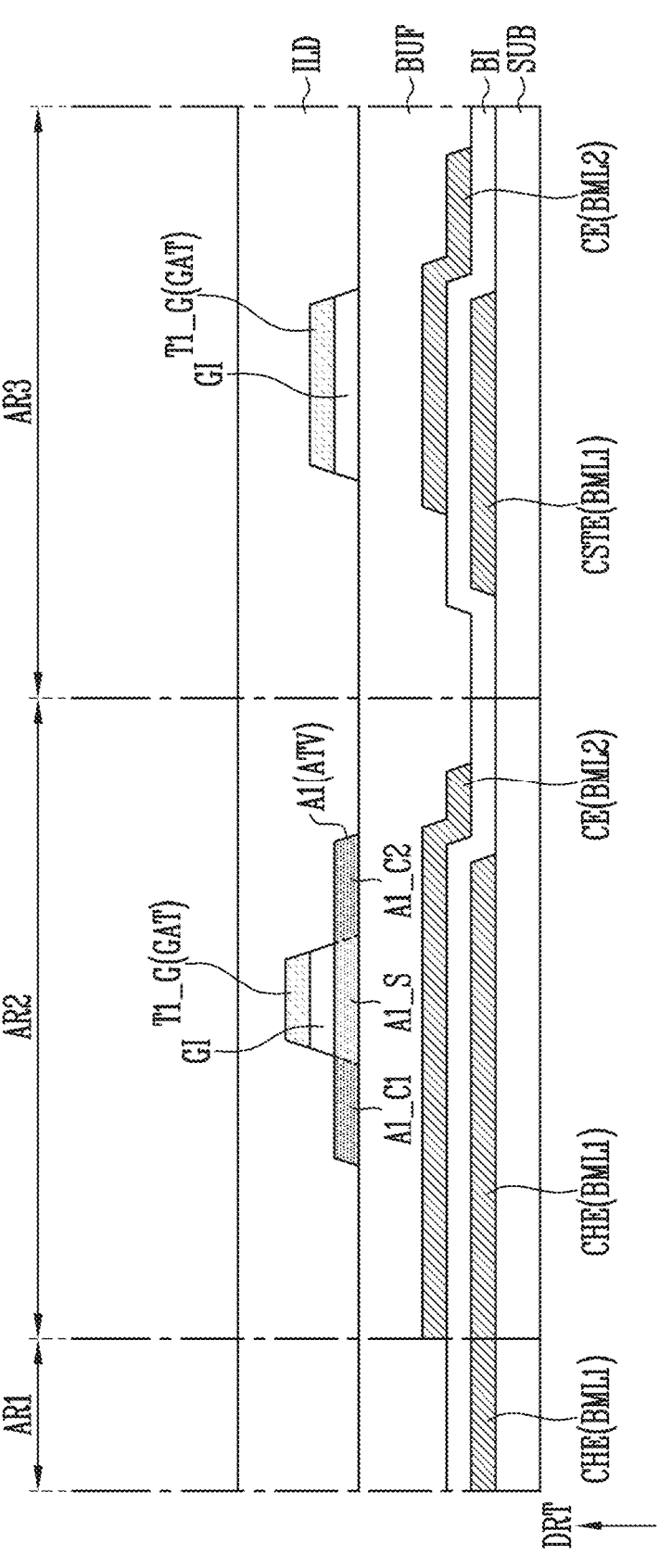

Referring to FIG. 27, to cover the semiconductor layer ATV, the gate insulating layer GI, and the gate conductive layer GAT, the interlayer insulating layer ILD may be formed on the buffer layer BUF.

Figure 28:
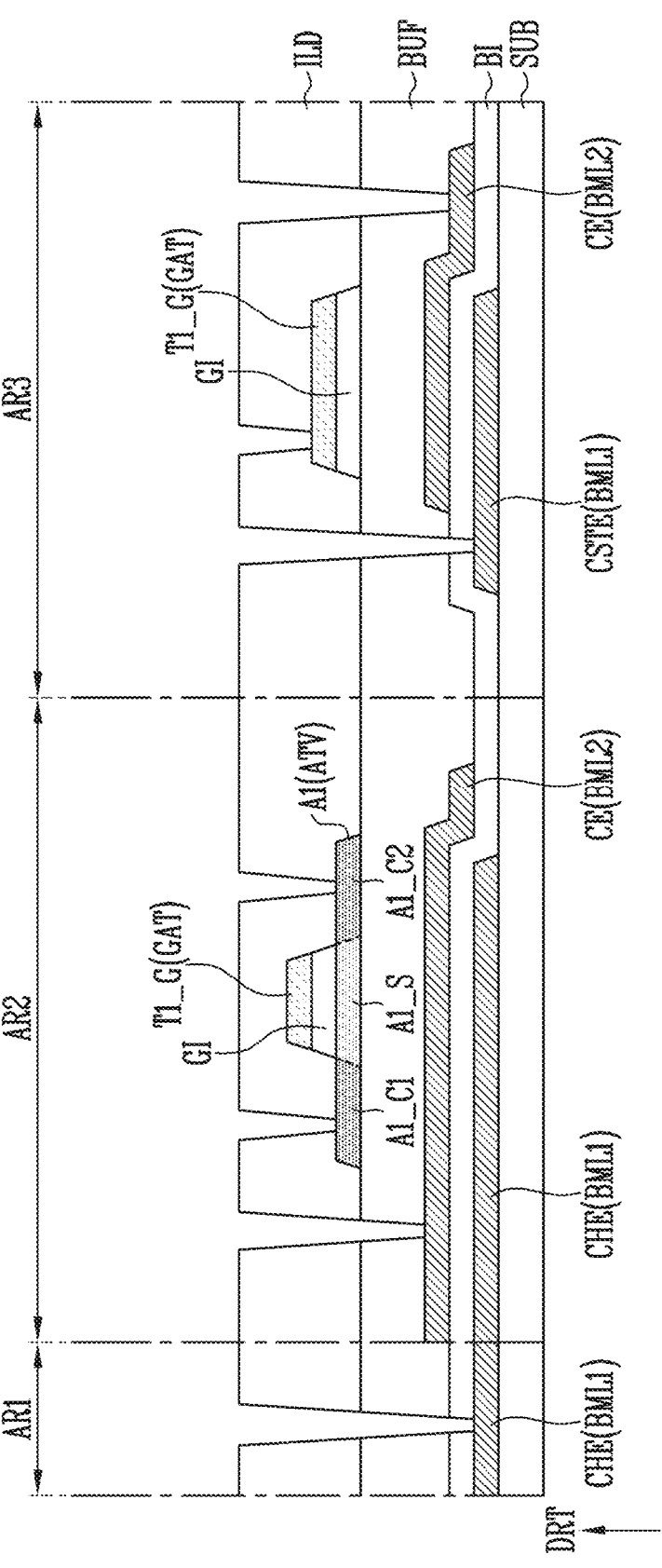

Referring to FIG. 28, to implement electrical connection of the semiconductor layer ATV and the conductive layers BML1, BML2, and GAT described with reference to FIG. 4, through holes may be formed in the interlayer insulating layer ILD.

Figure 29:
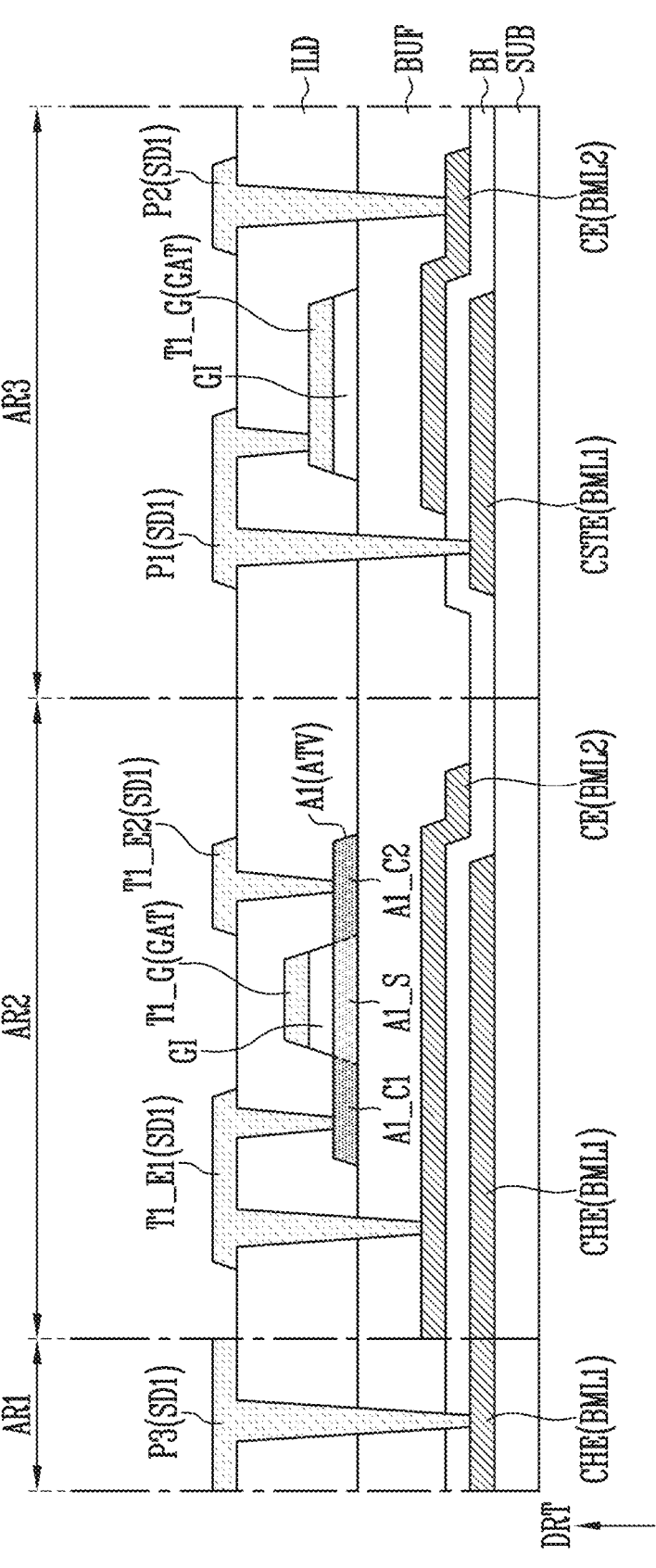

Referring to FIG. 29, the first SD conductive layer SD1 may be formed on the interlayer insulating layer ILD (at step SS8). The first SD conductive layer SD1 may include multiple first SD conductive patterns. For example, the first SD conductive layer SD1 may include a first pattern P1, a second pattern P2, a third pattern P3, a first electrode pattern T1_E1, and a second electrode pattern T1_E2. The first SD conducive patterns may electrically contact the conductive layers BML1, BML2, and GAT and/or the semiconductor layer ATV through the through holes formed in the interlayer insulating layer ILD.

In accordance with embodiments of the disclosure, a first bottom conductive layer and a second bottom conductive layer that form a pixel may each include a stacked structure in which a first metal layer, an alloy layer, and a second metal layer are stacked on each other. Accordingly, a hillock may be prevented from occurring in the first metal layer, whereby a pixel having excellent reliability may be provided.

Figure 30:
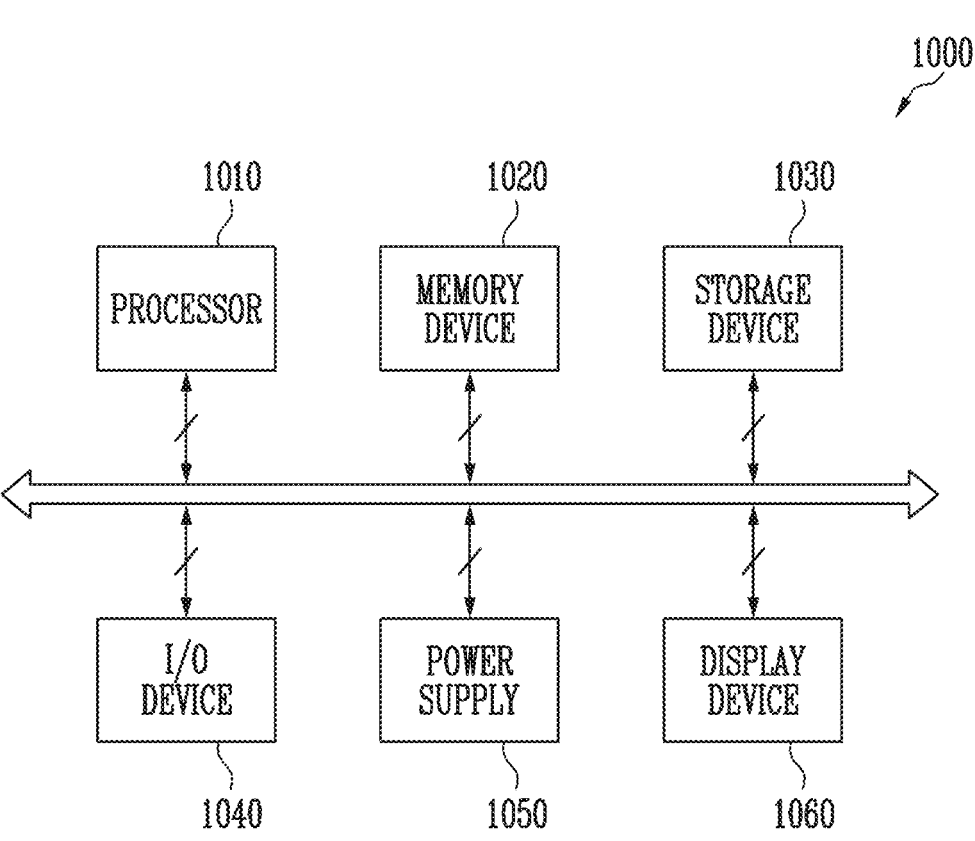
FIG. 30 is a schematic block diagram illustrating an electronic device including a display device in accordance with embodiments of the disclosure.
Figure 31:
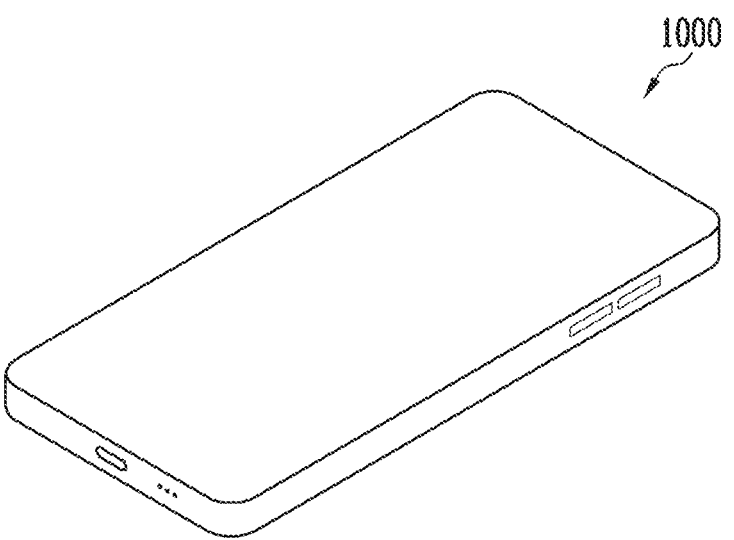
FIG. 31 is a schematic diagram illustrating an example where the electronic device of FIG. 30 is a smartphone.
Figure 32:
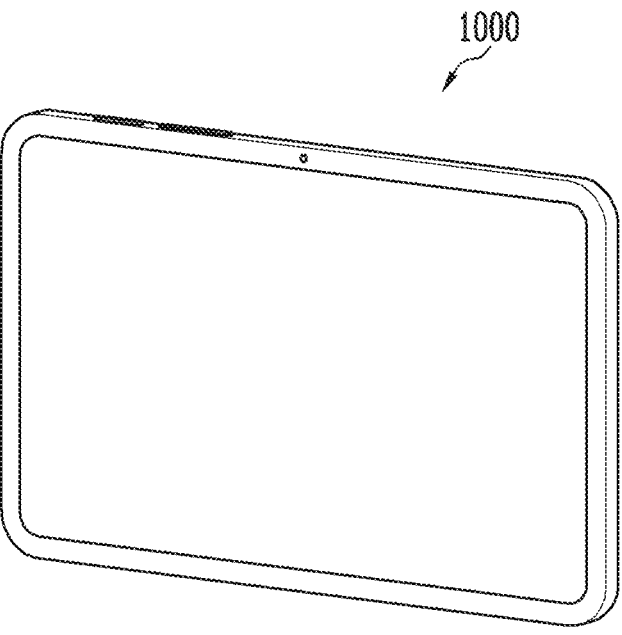
FIG. 32 is a schematic diagram illustrating an example where the electronic device of FIG. 30 is a tablet computer.

FIG. 30 is a schematic block diagram illustrating an electronic device including a display device in accordance with embodiments of the disclosure. FIG. 31 is a schematic diagram illustrating an example where the electronic device of FIG. 30 is a smartphone. FIG. 32 is a schematic diagram illustrating an example where the electronic device of FIG. 30 is a tablet computer.

Referring to FIGS. 30 to 32, an electronic device 1000 may include a processor 1010, a memory device 1020, a storage device 1030, an input/output (I/O) device 1040, a power supply 1050, and a display device 1060. The display device 1060 may be the display device 10 of FIG. 1. In this case, the display device 1060 may include pixels described with reference to FIGS. 2 to 12. The electronic device 1000 may further include various ports for communication with a video card, a sound card, a memory card, a USB device, or other systems. In an embodiment, as illustrated in FIG. 31, the electronic device 1000 may be a smartphone. In an embodiment, as illustrated in FIG. 32, the electronic device 1000 may be a tablet computer. However, the aforementioned examples are illustrative, and the electronic device 1000 is not necessarily limited to the aforementioned examples. For example, the electronic device 1000 may be a cellular phone, a video phone, a smart pad, a smartwatch, a navigation device for vehicles, a computer monitor, a laptop computer, a head-mounted display device, or the like.

The processor 1010 may perform specific calculations or tasks. In an embodiment, the processor 1010 may be a microprocessor, a central processing unit, an application processor, or the like. The processor 1010 may be connected to other components through an address bus, a control bus, a data bus, and the like. In an embodiment, the processor 1010 may be connected to an expansion bus such as a peripheral component interconnect (PCI) bus. In an embodiment, the processor 1010 may provide input image data to the display device 1060. Hence, the display device 1060 may display an image based on the input image data provided from the processor 1010.

The memory device 1020 may store data needed to perform the operation of the electronic device 1000. The memory device 1020 may function as a working memory and/or a buffer memory for the processor 1010. For example, the memory device 1020 may include one or more volatile memory devices such as a dynamic random access memory (DRAM) device, a static random access memory (SRAM) device, and a mobile DRAM device.

The storage device 1030 may store data in response to control signals or data from the processor 1010. The storage device 1030 may include one or more non-volatile storages to retain the data even when the electronic device 1000 is powered off. In some embodiments, the storage device 1030 may include a solid state drive (SSD), a hard disk drive (HDD), a CD-ROM, or the like.

The I/O device 1040 may include input devices such as a keyboard, a keypad, a touchpad, a touch screen, and a mouse, and output devices such as a speaker and a printer.

In an embodiment, the display device 1060 may be integrated with the I/O device 1040.

The power supply 1050 may supply power needed to perform the operation of the electronic device 1000. For example, the power supply 1050 may include a power management integrated circuit (PMIC). In an embodiment, the power supply 1050 may supply power to the display device 1060.

The display device 1060 may display images in response to control signals or data from the processor 1010. The display device 1060 may be connected to other components through the buses or other communication links.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A pixel, comprising:
   a first bottom conductive layer including a plurality of first bottom conductive patterns;
   a second bottom conductive layer disposed on the first bottom conductive layer, and including a plurality of second bottom conductive patterns; and
   a semiconductor layer disposed on the second bottom conductive layer, wherein
   the first bottom conductive layer has a stacked structure including a first metal layer, an alloy layer, and a second metal layer stacked on each other,
   the second bottom conductive layer has a stacked structure including a first metal layer, an alloy layer, and a second metal layer stacked on each other, and
   a thickness of the alloy layer in the first bottom conductive layer is greater than a thickness of the alloy layer in the second bottom conductive layer.

2. The pixel according to claim 1, wherein
   the alloy layer of the first bottom conductive layer includes an alloy of a first metal material included in the first metal layer of the first bottom conductive layer and a second metal material included in the second metal layer of the first bottom conductive layer, and
   the alloy layer of the second bottom conductive layer includes an alloy of a first metal material included in the first metal layer of the second bottom conductive layer and a second metal material included in the second metal layer of the second bottom conductive layer.

3. The pixel according to claim 2, wherein
   the first metal material of the first bottom conductive layer includes aluminum (Al),
   the first metal material of the second bottom conductive layer includes Al,
   the second metal material of the first bottom conductive layer includes titanium (Ti), and
   the second metal material of the second bottom conductive layer includes Ti.

4. The pixel according to claim 1, further comprising:

a gate conductive layer disposed on the semiconductor layer, and including a plurality of gate conductive patterns; and a first source-drain (SD) conductive layer disposed on the gate conductive layer, and including a plurality of first source-drain (SD) conductive patterns.

5. The pixel according to claim 4, wherein the gate conductive layer has a stacked structure including a third metal layer and a fourth metal layer stacked on each other, and the first SD conductive layer has a stacked structure including a third metal layer and a fourth metal layer stacked on each other.

6. The pixel according to claim 5, wherein the third metal layer of the gate conductive layer and the fourth metal layer of the gate conductive layer directly contact each other, and the third metal layer of the first SD conductive layer and the fourth metal layer of the first SD conductive layer directly contact each other.

7. The pixel according to claim 5, wherein a thickness of at least one of the fourth metal layer of the gate conductive layer and the fourth metal layer of the first SD conductive layer is greater than a thickness of at least one of the second metal layer of the first bottom conductive layer and the second metal layer of the second bottom conductive layer.

8. The pixel according to claim 1, further comprising:

a driving transistor connected between a first power voltage line and a second power voltage line, and including an upper gate electrode and a lower gate electrode; and a light emitting element connected between the driving transistor and the second power voltage line.

9. The pixel according to claim 8, wherein the lower gate electrode of the driving transistor includes at least one of the plurality of second bottom conductive patterns.

10. The pixel according to claim 8, further comprising:

a hold capacitor connected between the lower gate electrode of the driving transistor and the first power voltage line.

11. The pixel according to claim 10, wherein a first terminal of the hold capacitor includes at least a portion of the lower gate electrode of the driving transistor, and a second terminal of the hold capacitor includes at least one of the plurality of first bottom conductive patterns.

12. A method of fabricating a pixel, comprising:

forming a first bottom conductive layer including a plurality of first bottom conductive patterns;

forming a second bottom conductive layer including a plurality of second bottom conductive patterns on the first bottom conductive layer; and forming a semiconductor layer on the second bottom conductive layer, wherein the first bottom conductive layer has a stacked structure including a first metal layer, an alloy layer, and a second metal layer stacked on each other, the second bottom conductive layer has a stacked structure including a first metal layer, an alloy layer, and a second metal layer stacked on each other, and a thickness of the alloy layer in the first bottom conductive layer is greater than a thickness of the alloy layer in the second bottom conductive layer.

13. The method according to claim 12, further comprising:

forming an insulating layer covering the first bottom conductive layer after forming the first bottom conductive layer.

14. The method according to claim 13, wherein forming the insulating layer further comprises heat-treating the insulating layer.

15. The method according to claim 12, further comprising:

forming a buffer layer covering the second bottom conductive layer after forming the second bottom conductive layer.

16. The method according to claim 15, wherein forming the buffer layer further comprises heat-treating the buffer layer.

17. The method according to claim 12, further comprising:

forming a gate insulating layer covering at least a portion of the semiconductor layer after forming the semiconductor layer.

18. The method according to claim 17, wherein forming the gate insulating layer further comprises heat-treating the gate insulating layer.

19. The method according to claim 12, wherein the alloy layer of the first bottom conductive layer includes an alloy of a first metal material included in the first metal layer of the first bottom conductive layer and a second metal material included in the second metal layer of the first bottom conductive layer, and the alloy layer of the second bottom conductive layer includes an alloy of a first metal material included in the first metal layer of the second bottom conductive layer and a second metal material included in the second metal layer of the second bottom conductive layer.

20. The method according to claim 19, wherein the first metal material of the first bottom conductive layer includes aluminum (Al), the first metal material of the second bottom conductive layer includes Al, the second metal material of the first bottom conductive layer includes titanium (Ti), and the second metal material of the second bottom conductive layer includes Ti.

21. An electronic device, comprising:

a processor to provide input image data; and a display device to display an image based on the input image data, the display device including a pixel, wherein the pixel includes:

a first bottom conductive layer including a plurality of first bottom conductive patterns;

a second bottom conductive layer disposed on the first bottom conductive layer, and including a plurality of second bottom conductive patterns; and a semiconductor layer disposed on the second bottom conductive layer, wherein the first bottom conductive layer has a stacked structure including a first metal layer, an alloy layer, and a second metal layer stacked on each other, the second bottom conductive layer has a stacked structure including a first metal layer, an alloy layer, and a second metal layer stacked on each other, and a thickness of the alloy layer in the first bottom conductive layer is greater than a thickness of the alloy layer in the second bottom conductive layer.

* * * * *